United States Patent
Sakakibara et al.

(10) Patent No.: US 7,227,335 B2
(45) Date of Patent: Jun. 5, 2007

(54) METHOD AND APPARATUS FOR DIAGNOSING THE CONDITION OF A RECHARGEABLE BATTERY

(75) Inventors: Kazuyuki Sakakibara, Anjo (JP); Masaaki Fukumoto, Anjo (JP)

(73) Assignee: Makita Corporation, Anjo-Shi, Aichi (JP)

( * ) Notice: Subject to any disclaimer, the term of this patent is extended or adjusted under 35 U.S.C. 154(b) by 397 days.

(21) Appl. No.: 10/887,428

(22) Filed: Jul. 8, 2004

(65) Prior Publication Data

US 2005/0017686 A1    Jan. 27, 2005

(30) Foreign Application Priority Data

Jul. 22, 2003  (JP)  ............................. 2003-199717
Feb. 18, 2004  (JP)  ............................. 2004-040849

(51) Int. Cl.
*H01M 10/44* (2006.01)
(52) U.S. Cl. .................................................. 320/132
(58) Field of Classification Search ................ 320/127, 320/132, 149, 150; 324/426, 427, 430, 433
See application file for complete search history.

(56) References Cited

U.S. PATENT DOCUMENTS 6,218,806 B1    4/2001   Brotto et al.

2005/0001625 A1*  1/2005  Ashtiani et al. ............ 324/426

FOREIGN PATENT DOCUMENTS

| JP | 6-186310 | 8/1994 |
|---|---|---|
| JP | 10-66266 | 3/1998 |
| JP | 10-321261 | 4/1998 |
| JP | 11-233162 | 8/1999 |
| JP | 2000-32678 | 1/2000 |
| JP | 2000-215923 | 4/2000 |
| JP | 2000-223164 | 8/2000 |

OTHER PUBLICATIONS

European Search Report; Aug. 30, 2005.

\* cited by examiner

*Primary Examiner*—Edward H. Tso
(74) *Attorney, Agent, or Firm*—Orrick Herrington & Sutcliffe, LLP

(57) ABSTRACT

A diagnostic technique for determining whether the degradation of a rechargeable battery is normal or abnormal is provided.

A device for determining whether the degradation of a rechargeable battery is normal or abnormal comprises a device for measuring a degradation indicator of a rechargeable battery 18, a device for determining the usage quantity of the rechargeable battery, and a device for comparing the usage quantity with a reference usage quantity in the case where the measured degradation indicator exceeds a reference degradation value.

16 Claims, 20 Drawing Sheets

FIG. 21

| | The First Diagnosis Result | | | |
|---|---|---|---|---|
| | Abnormally Degrading | Normally Degrading | Abnormally Degraded | Normally Degraded |
| The Second Diagnosis Result — Abnormally Degrading | Abnormally Degrading | Non-active | — | — |
| Normally Degrading | Abnormally Degrading | Normally degrading | — | — |
| Abnormally Degraded | — | — | Abnormally Degraded | Abnormally Degraded |
| Normally Degraded | — | — | Abnormally Degraded | Normally Degraded |

METHOD AND APPARATUS FOR DIAGNOSING THE CONDITION OF A RECHARGEABLE BATTERY

CROSS-REFERENCE

This application claims priority based on Japanese Patent Application No. 2003-199717, filed on Jul. 22, 2003, and Japanese Patent Application No. 2004-40849, filed on Feb. 18, 2004, the entire contents of which are hereby incorporated by reference.

BACKGROUND OF THE INVENTION

1. Field of the Invention

The present invention relates to a technique for diagnosing rechargeable batteries capable of repeatedly undergoing discharging/recharging cycles. The present invention also relates to a technique for collecting information useful to diagnose rechargeable batteries.

2. Description of the Related Art

A variety of cordless electrical devices, such as mobile telephones, notebook computers, cordless vacuum cleaners, and cordless power tools, etc., utilize rechargeable batteries as their power source. In a case where a cordless electrical equipment malfunctions, it is necessary to know if the fault lies with the electrical equipment or with the rechargeable battery.

Furthermore, in a case where industrial goods, such as automobiles or computers, are manufactured on a mass production line by a power tool powered by a rechargeable battery, it may be possible that the tightening torque of the power tool is insufficient or an assigned operation cannot be completed within an allotted time frame, if a deteriorated rechargeable battery is used. Accordingly, it is necessary to determine when battery degradation has progressed beyond a permissible level.

The internal resistance of a rechargeable battery increases abruptly as degradation progresses. Japanese Laid-Open Patent Publication No. 2000-223164 discloses a device that measures the internal resistance of a battery and compares the measured resistance with a reference value to determine whether the degradation has progressed.

The charging/discharging capacity of rechargeable batteries also decreases abruptly as the degradation of the batteries progresses. Japanese Laid-Open Patent Publication No. H11-233162 discloses a device that measures the charging/discharging capacity of a battery and compares the measured capacity with a reference value to diagnose whether degradation has progressed.

A charging device capable of counting a number of charging operations of a rechargeable battery is known. When a battery that has already been charged a prescribed number of times is set to the charging device for recharging, this information is transmitted to an operator, thus informing the operator that battery degradation has progressed. A same charging device may charge two or more batteries. Japanese Laid-Open Patent Publication No. H10-66266 discloses a technique wherein batteries are provided with an ID respectively and the number of charging operations for each battery is counted with reference to the battery ID.

BRIEF SUMMARY OF THE INVENTION

The known battery diagnosing device described above is capable only of determining the end result: i.e. whether a battery has or has not degraded. Rechargeable batteries degrade as they are used, and this degradation itself cannot be avoided. However, steep or rapid degradation may be caused by the manner of use of the rechargeable batteries. Rechargeable batteries degrade rapidly if they are repeatedly over-discharged. When a battery is charged too rapidly, the battery temperature becomes too high, and the battery degrades rapidly. In the prior art, it is only possible to diagnose the end result: i.e. whether the battery has degraded or not. It is not possible to obtain useful information for determining whether the end result was caused by normal, unavoidable degradation, or caused by abnormally rapid degradation due to inappropriate manner of use or the like.

When the information necessary to determine whether the degradation was normal or abnormal is not obtained, it is not possible to objectively determine methods for minimizing battery degradation, for example whether the manner of use of the battery must be improved, whether the life of the battery will be lengthened if the manner of use thereof is improved, whether the battery has degraded normally and must be replaced, etc. When a battery degrades, battery users tend to believe that this signifies a problem in battery quality. If users believe that even normal batteries suffer from quality problems, the healthy growth of the battery industry will be retarded. For this reason, useful information that determines whether batteries have degraded normally or abnormally should be obtained.

It is one object of the present invention to present a technique for diagnosing whether degradation of a rechargeable battery was normal or abnormal. Further, the invention presents an information collecting technique wherein information useful for this purpose can be obtained.

With existing techniques, it is only possible to determine the end result: i.e. whether a battery has or has not degraded to a limit level. It is not possible to diagnose whether the degradation is progressing normally or abnormally before the degradation progresses to the limit level.

It is another object of the present invention to present a technique for diagnosing whether the degradation is progressing normally or abnormally. If abnormal degradation progress is found before the battery has degraded to the limit level, an operator may determine that the battery was being used incorrectly, and the degradation speed may be slowed down by improving the manner of use.

With existing techniques, it is not possible to diagnose the extent of battery degradation until the degradation of the rechargeable battery proceeds beyond a limit level. With existing techniques, it is only possible to diagnose whether a battery has degraded to the limit level or not. A diagnosing technique for estimating how much future use may be possible (for example, how many further charging/discharging cycles can be performed) before degradation progresses beyond the limit level, has not been developed yet.

It is one another object of the present invention to present a technique for estimating how much future use may be possible before degradation progress to the limit level, at which time further use of the battery must be halted.

A battery diagnostic device of the present invention determines whether a rechargeable battery has degraded normally or abnormally. The device comprises a detector for measuring a degradation indicator of a rechargeable battery, a recorder for keeping record of a usage quantity of the battery, and a computer for comparing the determined usage quantity with a reference usage quantity when the measured degradation indicator has exceeded a reference degradation value.

Here, in a case where the reference degradation value is determined to be a lower limit value of the degradation indicator, the term 'the measured degradation indicator has exceeded the reference degradation value' refers to the measured degradation indicator falling below the reference degradation value. Further, in a case where the reference degradation value is determined to be an upper limit value of the degradation indicator, the term 'the measured degradation indicator has exceeded the reference degradation value' refers to the measured degradation indicator rising above the reference degradation value.

It is possible to determine whether the rechargeable battery has degraded to a limit level by measuring the degradation indicator that changes in accordance with the degradation of the rechargeable battery, and by comparing the measured degradation indicator with the reference degradation value. Thus far, the diagnosing process is identical to conventional diagnostic techniques, and various degradation indicators may be chosen.

In this device, in addition to the above, the usage quantity of the rechargeable battery is determined, and the usage quantity of the rechargeable battery when the measured degradation indicator has exceeded the reference degradation value is compared with the reference usage quantity. The reference usage quantity is determined from normal rechargeable batteries. The degradation indicator of the normal rechargeable batteries progresses normally, and exceeds the reference degradation value at a certain usage quantity. The average usage quantity at which the degradation indicator of the normal rechargeable batteries exceeds the reference degradation value may be adapted as the reference usage quantity. If the rechargeable battery has degraded when its usage quantity is lower than the reference usage quantity, it can be determined that the degradation has progressed abnormally and that there was a problem in the manner of use of the rechargeable battery. The unnecessary exhaustion of new rechargeable batteries can thus be prevented by revising the manner of use. If the rechargeable battery has degraded when its usage quantity is longer than the reference usage quantity, it can be determined that the degradation has progressed normally, there was not a problem in the manner of use, and there was not a quality problem with the rechargeable battery.

According to this device, it can be determined whether the battery has degraded normally or abnormally, and necessary countermeasures, etc. can be adopted.

This invention has created a novel and useful method of diagnosing a rechargeable battery. This method comprises a step of measuring a degradation indicator of the rechargeable battery, a step of determining a usage quantity of the rechargeable battery, and a step of comparing the determined usage quantity with a reference usage quantity when the measured degradation indicator exceeds the reference degradation value.

According to this method, it is possible to know whether the battery has degraded normally or abnormally, allowing necessary countermeasures, etc. to be adopted.

The present invention can be utilized not only to determine whether a degraded rechargeable battery has degraded normally or abnormally, but can also be utilized to determine whether a rechargeable battery currently being used is degrading normally or abnormally. That is, it is possible to determine whether normal degradation or abnormal degradation is occurring.

If this is done, any necessary changes to the manner of use can be determined, for example whether the manner of use should be continued unchanged, or whether degradation will occur within an abnormally short period unless the manner of use, etc. is changed.

One type of the battery diagnosing device of the invention comprises a device for measuring a degradation indicator of the rechargeable battery, a device for determining a usage quantity of the rechargeable battery, a device for storing a reference degradation map, this being a two-dimensional map whose axes are the degradation indicator and the usage quantity, the map being divided into a normally degrading region and an abnormally degrading region, and a device for determining whether the measured degradation indicator and the determined usage quantity belong in the normally degrading region or the abnormally degrading region of the reference degradation map.

Research of the present inventors has ascertained that when a pair of values consisting of the measured degradation indicator and the determined usage quantity is plotted on the two-dimensional map whose axes are the degradation indicator and the usage quantity, the pair of values will lie within a prescribed region when a normal rechargeable battery is used normally. By contrast, when the rechargeable battery is used in an inappropriate manner, the pair of values will lie within a different region.

With this device, the degradation indicator and the usage quantity of the rechargeable battery are detected. This device also determines whether the pair of values belongs in the normally degrading region or the abnormally degrading region within the two dimensional map. By this means, it is possible to determine whether the rechargeable battery is degrading normally or abnormally. If the degradation of the rechargeable battery is progressing abnormally, further degradation of the rechargeable battery can be prevented by, for example, improving the manner of use of the rechargeable battery.

By diagnosing the rechargeable battery with this device, it can be determined whether the rechargeable battery that is being utilized is degrading normally or abnormally, and necessary countermeasures can be considered.

In one aspect of the present invention, a method is presented for determining whether a rechargeable battery is degrading normally or abnormally. This method comprises a step of measuring a degradation indicator of the rechargeable battery, a step of determining a usage quantity of the rechargeable battery, a step of storing a reference degradation map in advance, this being a two-dimensional map whose axes are the degradation indicator and the usage quantity with the map being divided into a normally degrading region and an abnormally degrading region, and a step of determining whether the pair of measured degradation indicator and the determined usage quantity belongs in the normally degrading region or the abnormally degrading region of the reference degradation map.

By diagnosing the rechargeable battery with this method, it is possible to know whether the rechargeable battery is degrading normally or abnormally, and necessary countermeasures can be considered.

When the degradation indicator and usage quantity are detected, it becomes possible to determine whether the degradation of the rechargeable battery is progressing normally or abnormally. However, it is also possible to estimate a future usage quantity that the rechargeable battery have. The future usage quantity means how much the rechargeable battery may be used until the degradation thereof proceeds to a prescribed level.

One type of the device created by the present invention comprises a device for measuring a degradation indicator of the rechargeable battery, a device for determining a usage quantity of the rechargeable battery, a device for accumulating and storing a plurality of pairs of measured degradation indicator and determined usage quantity, and a device for estimating, from the plurality of pairs of measured degradation indicator and determined usage quantity, a future usage quantity.

If a plurality of pairs of measured degradation indicator and determined usage quantity is accumulated and stored, it is possible to determine a trend according to which the degradation indicator changes as the usage quantity increases. By utilizing this trend, it is possible to estimate the future usage quantity. The operator may evaluate how much the rechargeable battery may be used until the degradation thereof proceeds to the prescribed level.

The trend according to which the degradation indicator changes as the usage quantity increases (this trend varies greatly in accordance with the manner of use) is determined by means of the present device. It is possible to accurately estimate the future usage quantity based on the trend that has been determined.

One of the methods of the present invention comprises a step of measuring a degradation indicator of the rechargeable battery, a step of determining a usage quantity of the rechargeable battery, a step of accumulating and storing a plurality of pairs of measured degradation indicator and determined usage quantity, and a step of estimating a future usage quantity, from the plurality of pairs of measured degradation indicator and determined usage quantity thus accumulated and stored. The future usage quantity means how much the rechargeable battery can be used until the degradation thereof proceeds to a prescribed level.

By this method, it is possible to accurately estimate the future usage quantity.

Furthermore, the present invention also presents another technique for estimating a future usage quantity of a rechargeable battery.

The battery diagnosing device of this mode comprises a device for measuring a degradation indicator of the rechargeable battery, a device for determining a usage quantity of the rechargeable battery, a device for storing a standard relationship between the degradation indicator and the usage quantity, and a device for estimating, from the pair of measured degradation indicator and the determined usage quantity, and the standard relationship thus stored, a future usage quantity.

The degradation indicator of the rechargeable battery changes as the usage quantity increases. The rate of change for the degradation indicator with respect to the degree of increase in the usage quantity is not same throughout the period of use of the rechargeable battery, but varies according to the usage quantity. During the period of initial use, the rechargeable battery has a low usage quantity, there is usually little change in the degradation indicators as the usage quantity increases. By contrast, during the period of final use, the rechargeable battery has a high usage quantity, there is usually a great deal of change in the degradation indicator as the usage quantity increases. It is not possible to know how greatly the degradation indicator will change as the usage quantity increases by detecting merely the degradation indicator. However, it is possible to know how greatly the degradation indicator will change as the usage quantity increases by detecting both the degradation indicator and the usage quantity.

In the present device, the standard relationship between the degradation indicator and the usage quantity is stored. Moreover, the pair of the degradation indicator and the usage quantity is detected. As a result, it is possible to know, from the standard relationship, the relationship that the degradation indicators will have with respect to the usage quantity after the most recent detection of the degradation indicator, and it is thereby possible to know how long the rechargeable battery can be used after the most recent detection until the degradation indicator will exceed the reference degradation value.

Although the rate of change for the degradation indicator with respect to the degree of increase in usage quantity is not same throughout the period of use of the rechargeable battery, it is possible by means of the present device to extrapolate the trend whereby this change occurs in accordance with the usage quantity, and it is possible to accurately estimate the future usage quantity.

The technique described above also presents another method for estimating the future usage quantity. This diagnostic method for the rechargeable battery comprises a step of measuring a degradation indicator of the rechargeable battery, a step of determining a usage quantity of the rechargeable battery, a step of storing a standard relationship between the degradation indicator and the usage quantity in advance, and a step of estimating, from the pair of measured degradation indicator and the determined usage quantity, and the standard relationship thus stored, a future usage quantity.

By means of this method, it is possible to accurately estimate the future usage quantity.

In the diagnosing devices and diagnosing methods described above, it is preferred that either internal resistance or charging/discharging capacity is adopted as the degradation indicator. Further, it is preferred that any of the cumulative discharging time, the cumulative charging time, the cumulative quantity of discharged power, the cumulative quantity of charged power, or cumulative number of charging/discharging cycles are adopted as the usage quantity.

Internal resistance is a suitable degradation indicator because the increase in the internal resistance of the rechargeable battery corresponds closely to the progress of degradation of the rechargeable battery. Charging/discharging capacity is also a suitable degradation indicator because a decrease in the charging/discharging capacity corresponds closely to the progress of degradation of the rechargeable battery.

Furthermore, the degradation of the rechargeable battery progresses in accordance with the cumulative discharging time, the cumulative charging time, the cumulative quantity of discharged power, the cumulative quantity of charged power, and the cumulative number of charging/discharging cycles. Consequently, the cumulative discharging time, the cumulative charging time, the cumulative quantity of discharged power, the cumulative quantity of charged power, or the cumulative number of charging/discharging cycles can be chosen as the usage quantity.

It is possible to accurately diagnose the rechargeable battery by measuring the internal resistance or charging/discharging capacity, and by determining the cumulative discharging time, the cumulative charging time, the cumulative quantity of discharged power, the cumulative quantity of charged power, or the cumulative number of charging/discharging cycles. The degradation indicator and usage quantity may be selected from the values as described above in accordance with the operating environment of the rechargeable battery.

It is preferred that the usage quantity, this being any of the cumulative discharging time, the cumulative charging time, the cumulative quantity of discharged power, the cumulative quantity of charged power, or the cumulative number of charging/discharging cycles, is modified based on the frequency of occurrence of over discharging and/or over-rapid charging.

If the rechargeable battery is over discharged or charged too rapidly, the degradation thereof progresses more rapidly than usual. If the battery is used in a manner that causes over discharging or over-rapid charging to occur frequently, even if the battery is not defective, degradation will progress rapidly. Therefore, in order to diagnose whether the battery is defective or not, abnormally rapid degradation due to incorrect usage should be excluded. In order to exclude abnormally rapid degradation due to incorrect usage, it is preferred that the usage quantity referred to for diagnosing should be modified to be larger than the measured usage quantity. If a modified usage quantity larger than the measured usage quantity is used when diagnosing the rechargeable battery which has been frequently over discharged or charged too rapidly, abnormally rapid degradation due to incorrect usage may be excluded from the diagnosis, and it is possible to diagnose whether the battery is defective.

It may be possible that a rechargeable battery is recharged fully after the battery has slightly discharged. If the cycle of slight discharging and full recharging is repeated, the battery voltage will fall abruptly after the rechargeable battery discharges only a relatively small amount of power. In a case where a battery driver has a built-in function to halt operation when the battery voltage falls to a prescribed voltage, the charging/discharging capacity of the battery drops. It is know that a drop in the charging/discharging capacity due to repeated cycles of slight discharging and full charging is not permanent but temporary. It is known that if the battery is discharged completely until the battery voltage becomes very low, then charging/discharging capacity will return to a normal value. A battery whose charging/discharging capacity has dropped temporarily due to repeated cycles of slight discharging and full charging may be recovered by a full discharging and full recharging operation (the so-called refresh operation). A battery whose capacity has dropped temporary is in a non-active state, and should be distinguished from a degraded battery.

Consequently, a technique is required to distinguish whether the rechargeable battery is in a non-active state or an active state. If the battery is in the non-active state, it may be possible to recover the temporary drop of charging/discharging capacity. If the battery is in the active state, the drop of charging/discharging capacity is not temporary, and it is not possible to recover battery capacity by using refresh operation.

If it is determined that a rechargeable battery is in the non-active state, the charging/discharging capacity can be recovered by performing the refresh operation. If it is determined that the rechargeable battery is in the active state and has degraded abnormally, it is possible to ascertain that the manner of use, or the like, of the rechargeable battery was inappropriate, and improvements to the manner of use should be developed. The present invention is also useful for this purpose.

A type of battery diagnosing device of the present invention is created for the above purpose. The device determines whether a rechargeable battery is in an active state or a non-active state. The battery diagnosing device of this type comprises, a device for measuring a first degradation indicator of the rechargeable battery, a device for measuring a second degradation indicator of the rechargeable battery, a device for storing a reference activity map, this being a two-dimensional map whose axes are the first degradation indicator and the second degradation indicator, the map being divided into an active region and a non-active region, and a device for determining whether the pair, consisting of the measured first degradation indicator and the measured second degradation indicator, belongs in the active region or the non-active region of the reference map.

The research of the present inventors has determined that when the pair of the measured first degradation indicator and the second degradation indicator is plotted on the two-dimensional map which displays values for the first degradation indicator and the second degradation indicator, the pair is plotted within a prescribed region when the rechargeable battery is in an active state. By contrast, the pair is plotted within a different region when the rechargeable battery is in a non-active state.

With this device, the first degradation indicator and the second degradation indicator are detected as a pair, and it is determined whether the pair belongs in the active region or the non-active region. By this means, it is possible to determine whether the rechargeable battery is in the active state or the non-active state. If the rechargeable battery is in the non-active state, the charging/discharging capacity thereof can be recovered by performing the refresh operation, and it is possible to prevent the rechargeable battery from reassuming the non-active state by revising the manner of use of the rechargeable battery.

By diagnosing the rechargeable battery with this device, it is possible to determine whether the rechargeable battery is in the active state or the non-active state.

A method is presented, using the technique described above, for determining whether a rechargeable battery is in an active state or a non-active state. This battery diagnosing method comprises a step of measuring a first degradation indicator for the rechargeable battery, a step of measuring a second degradation indicator for the rechargeable battery, a step for storing in advance a reference activity map, this being a two-dimensional map whose axes are the first degradation indicator and the second degradation indicator, the map being divided into an active region and a non-active region, and a process of determining whether the pair, consisting of the measured first degradation indicator and measured second degradation indicator, belongs in the active region or the non-active region of the stored reference map.

By diagnosing the rechargeable battery with this method, it is possible to determine whether the rechargeable battery is in the active state or the non-active state.

In the diagnosing device and diagnosing method described above, it is preferred that the first degradation indicator is the internal resistance of the rechargeable battery, and that the second degradation indicator is the charging/discharging capacity of the rechargeable battery.

In the rechargeable battery in the non-active state, internal resistance scarcely increases although charging/discharging capacity falls. By contrast, in the degrading battery in the active state, internal resistance increases as charging/discharging capacity falls. From this, utilizing the two-dimensional map whose axes are the internal resistance of the rechargeable battery and charging/discharging capacity of the rechargeable battery, it is possible to accurately distinguish the active region and the non-active region, and it is possible to accurately know whether the rechargeable battery is in the active state or the non-active state.

The present invention may be incorporated into the adaptor described below. The adaptor is interposed between a charging device and a rechargeable battery. The adapter determines whether the rechargeable battery is in an active state or a non-active state and performs the refresh operation by fully discharging and fully recharging when the battery is in the non-active state. The adaptor comprises a supply circuit for supplying power of a charging current from the charging device to the battery via the adaptor, a circuit for discharging current from the rechargeable battery, a switching circuit for causing either the supply circuit or the discharging circuit to function, and a means for switching the switching circuit, this means causing the discharging circuit to function when a determining device has determined that a pair of degradation indicators is in a non-active region.

The term 'charging device' includes charging devices for charging the rechargeable battery during the normal use of the rechargeable battery.

By interposing the adaptor between the charging device and the rechargeable battery, it is possible to determine whether the rechargeable battery is in the active state or the non-active state. When the rechargeable battery is in the non-active state, the rechargeable battery is forcibly fully discharged and fully charged thereafter by the adaptor. The rechargeable battery whose charging/discharging capacity is temporarily reduced in the non-active state can be restored by a refresh operation performed by the adapter.

When the charging/discharging capacity of the rechargeable battery is reduced, the rechargeable battery is connected with the charging device via the adaptor, and it determines whether the rechargeable battery is degrading in the active state, or is in the non-active state. Further, if the rechargeable battery is in the non-active state, it is possible to restore the charging/discharging capacity that has temporarily fallen by performing the refresh operation.

The rechargeable battery is used in a variety of conditions. Some users repeatedly charge rapidly, while some users use rechargeable batteries infrequently. Some users perform continuous operations with a light load over a long period, while some users intermittently repeat operations with a heavy load. Some users repeatedly over discharge rechargeable batteries until they have an extremely low battery voltage.

Although optimum manners of use should exist for various operating conditions, it is not easy to determine what they are. Many issues are unknown and remain to be investigated. Numerous examples must be collected. A large quantity of diagnostic information must be summarized and further analysis must be performed.

The present invention presents a diagnostic information collecting device that is useful for the above purpose. The diagnostic information collecting device comprises a plurality of terminal diagnosing devices for diagnosing a rechargeable battery and obtaining the diagnostic information, an information accumulating device for accumulating and storing the diagnostic information, and a communication means for connecting the terminal diagnosing devices and the information accumulating device via a computer network.

Each terminal diagnosing device can be a battery diagnosing device or an adaptor of the present invention. The communication means may be a computer network that transmits the diagnostic information obtained by the terminal diagnosing devices to the information accumulating device.

In this diagnostic information collecting device, the diagnostic information about the rechargeable batteries obtained by the battery diagnosing devices is transmitted to the information accumulating device via the computer network, and the diagnostic information about the rechargeable batteries is stored in the information accumulating device. Many items of diagnostic information are accumulated in the information accumulating device, therefore various pieces of diagnostic information about the various rechargeable batteries that are used in a variety of conditions are collected. By analyzing the various diagnostic information collected in the information accumulating device, knowledge for the appropriate diagnosis of the rechargeable batteries can be developed further.

The reference values of the degradation indicator and the usage quantity, which are needed to determine the state of degradation of the rechargeable battery, can be determined computationally on the basis of the specifications of the rechargeable battery, the estimated manner of use thereof, etc., or can be determined from actual test results, etc. However, it is extremely difficult to have the numerous elements concerning degradation faithfully reflected computationally. In addition, in the case where the reference values are determined on the basis of actual test results, the number of samples that can be obtained is limited, and reliable reference values can not be determined from a limited number of samples. A technique for more accurately determining the state of degradation of the rechargeable battery is required.

The above problem may be solved by a reference value calculating means. The reference value calculating means extracts the relationship between the usage quantity and the degradation indicator from the diagnostic information accumulated by and stored in the information accumulating device of the diagnostic information collecting device of the present invention. The reference value calculating means also calculates at least one reference value concerning to the degradation indicator and the usage quantity. The reference value may be calculated from a normally degrading region, an abnormally degrading region, a standard relationship between the degradation indicator and the usage quantity, an active region, and a non-active region of a large number of the batteries.

The diagnostic information accumulated in the information accumulating device includes diagnostic information that relates to the rechargeable batteries in a variety of conditions. By extracting the relationship between the usage quantity and the degradation indicator from the plurality of items of diagnostic information that have been accumulated and stored, it is possible to more accurately calculate the reference value of the degradation indicator or the usage quantity, etc, that is used to determine the state of degradation of the rechargeable battery.

A communicating device transmits the reference value calculated by the reference value calculating means to the terminal diagnosing devices. Since the terminal diagnosing devices can obtain a more accurate reference value, the terminal diagnosing devices are able to more accurately determine the state of degradation of the rechargeable battery.

By means of the present invention, it is possible to determine whether a rechargeable battery has degraded normally or abnormally.

By means of the present invention, it is possible to determine whether a rechargeable battery is degrading normally or abnormally.

By means of the present invention, it is possible to estimate the future usage quantity, that is, how much the rechargeable battery may be used until it degrades to the prescribed level.

By means of the present invention, it is possible to determine whether the rechargeable battery is in the active state or the non-active state.

By means of the present invention, it is possible to obtain an information collecting device capable of obtaining information useful to diagnose a variety of rechargeable batteries.

BRIEF DESCRIPTION OF THE DRAWINGS

FIG. 21 shows a diagnostic reference utilized in a combined diagnosis of the battery diagnostic device of the third embodiment.

PREFERRED FEATURES TO PRACTICE THE INVENTION

Preferred features to practice the present invention are described below.

(1) The battery checking system comprises a charger, a checking adaptor attached to the charger, a computer device connected with to checking adaptor.

(2) The battery checking system diagnoses the state of degradation of rechargeable batteries within a battery pack attached to the checking adaptor.

(3) The battery pack includes a storage device (for example, an EEPROM) that stores charging number data, history of remaining quantity of power data, history of temperature data, charging characteristics data, battery pack data, etc.

(4) The charger is a charger that, when the battery pack is used normally, charges the battery pack.

(5) The checking adaptor has a switch that causes either a connecting circuit or a discharging circuit to function. The connecting circuit connects the charger and the rechargeable battery of the battery pack, and the discharging circuit causes the rechargeable battery to discharge.

(6) The computer device stores a reference degradation map with respect to internal resistance, this being a two-dimensional map of internal resistance and the cumulative number of chargings, the map being divided into a normally degrading region, an abnormally degrading region, a normally degraded region, and an abnormally degraded region. Furthermore, the computer device stores a reference activity map, this being a two-dimensional map between internal resistance and charging/discharging capacity, the map being divided into an active region and a non-active region.

(7) The computer device is provided with a display for communicating diagnosis results, etc. of the battery pack.

(8) The battery checking system is capable of reading information from the storage device enclosed within the battery pack, and is capable of writing information to the storage device enclosed within the battery pack. The battery checking system writes the diagnosis results to the storage device enclosed within the battery pack.

(9) The battery checking system is capable, by means of a charging circuit within the charger and the discharging circuit within the checking adaptor, of fully discharging and fully charging the battery pack.

(10) The battery checking system stores diagnostic information regarding the battery pack relating to previous diagnoses thereof. The diagnostic information is stored together with identifying information of the battery pack.

(11) The battery checking system is used while connected with the internet. The diagnostic information can be transmitted via the internet, and the reference degradation map relating to internal resistance, the reference activity map, etc. can be sent via the internet.

PREFERRED EMBODIMENTS OF THE INVENTION

Embodiment 1

Figure 1:
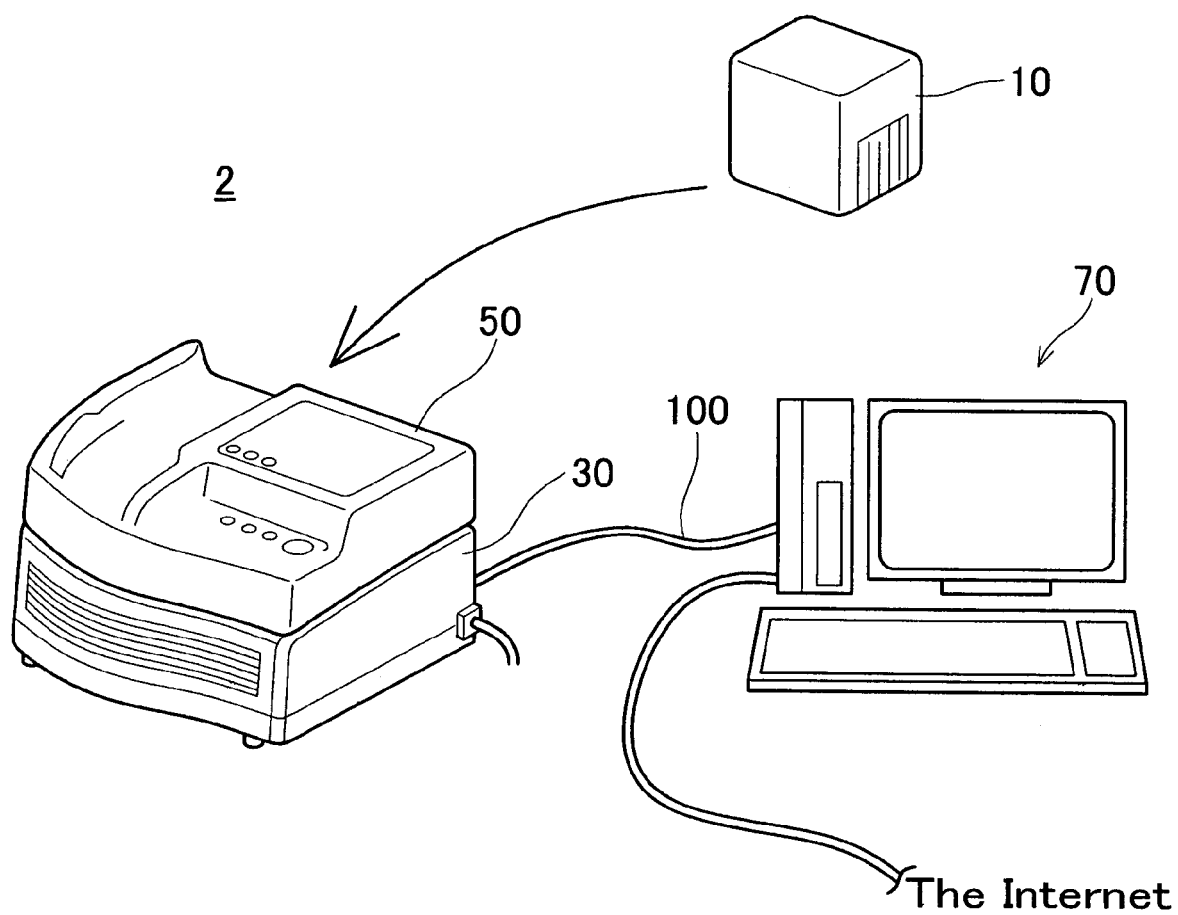
FIG. 1 shows the external appearance of a battery checking system.

A battery checking system 2 embodying the present invention will be described below referring to figures. FIG. 1 shows the external appearance of a battery checking system 2 of the present embodiment. The battery checking system 2 comprises a charger 30 for charging a battery pack 10, a checking adaptor 50, and a computer device 70, etc.

FIG. 1 shows a state wherein the checking adaptor 50 is attached to the charger 30, and the checking adaptor 50 and the computer device 70 are connected by a cable 100. In this state, the battery pack 10 is attached to the checking adaptor 50, the state of degradation of the battery pack 10 is diagnosed, and the diagnosis results are shown on the computer 70.

Figure 2:
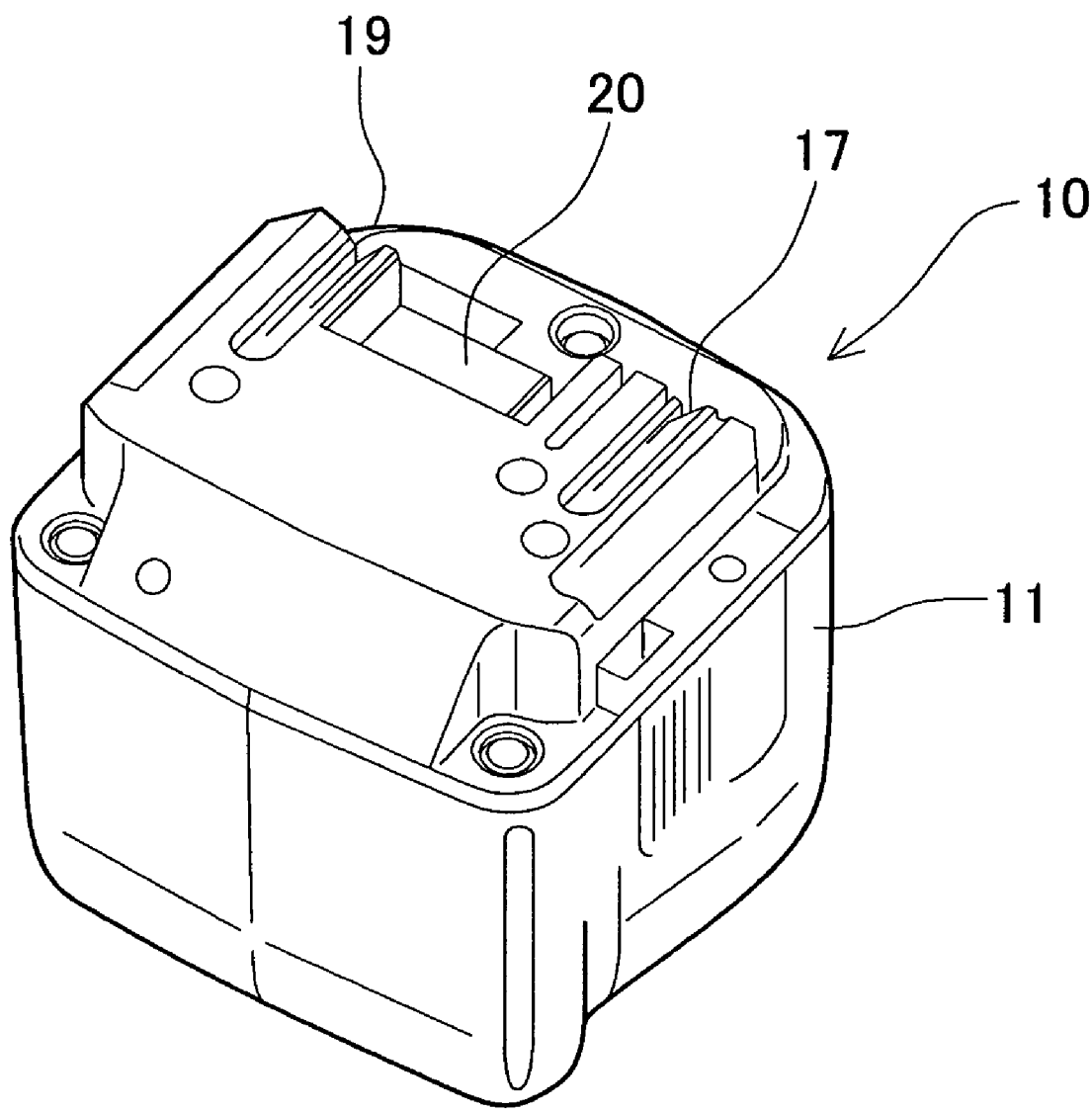
FIG. 2 shows the external appearance of a battery pack.
Figure 3:
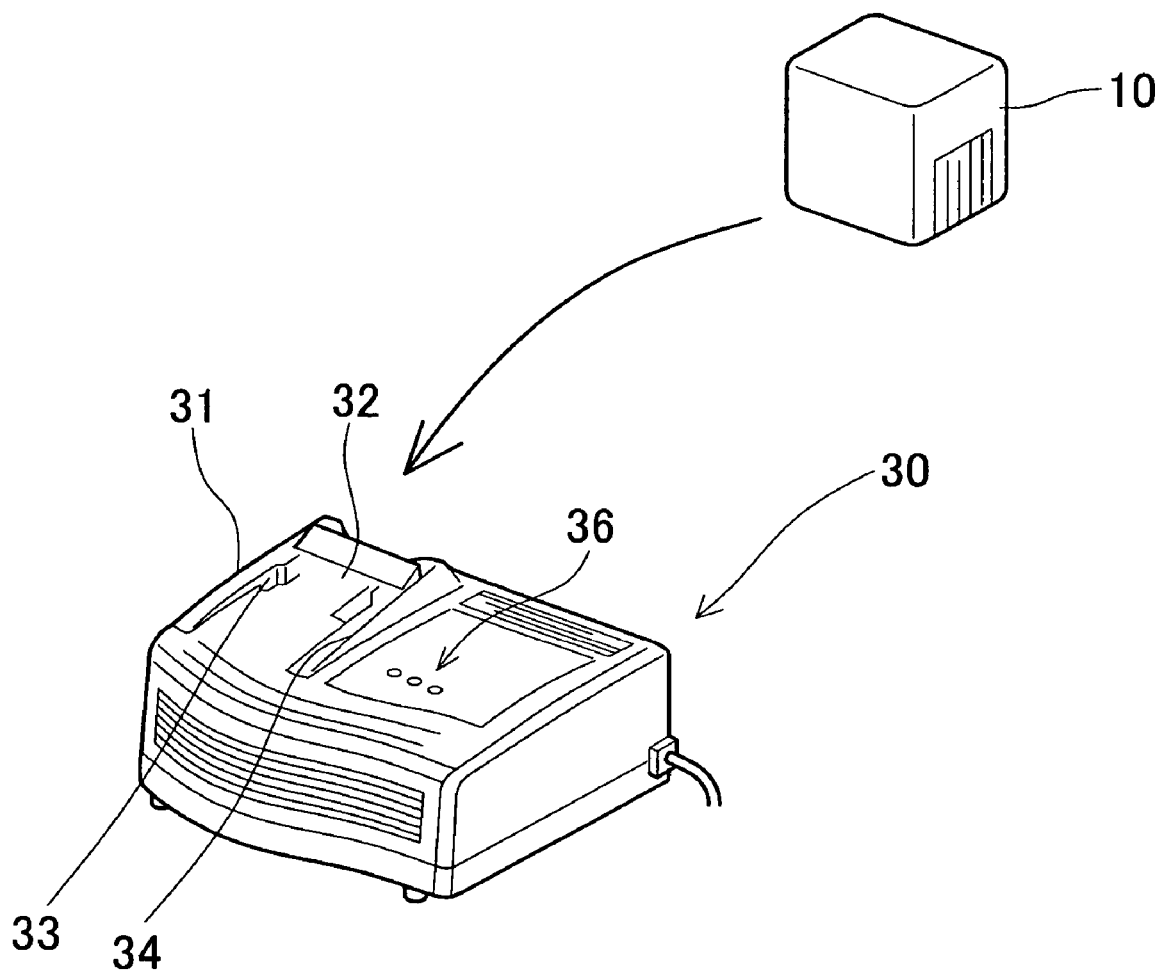
FIG. 3 shows the external appearance of a charger.

FIG. 2 shows the external appearance of the battery pack 10. FIG. 3 shows the external appearance of the charger 30.

Figure 4:
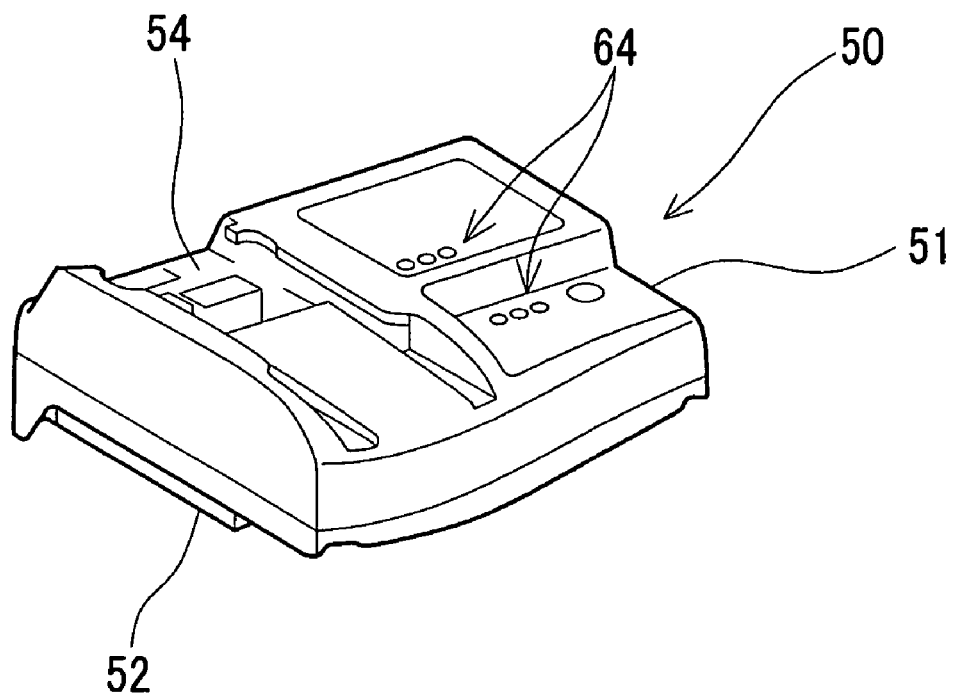
FIG. 4 shows the external appearance of a checking adaptor.
Figure 5:
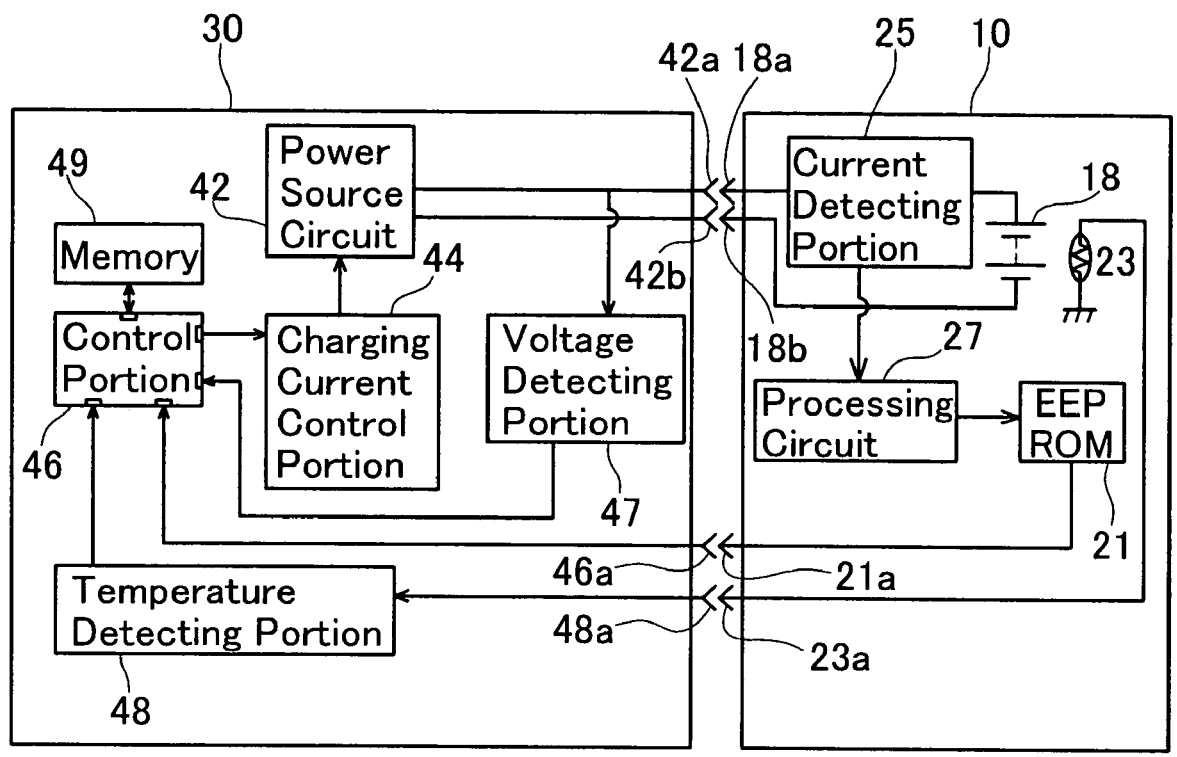
FIG. 5 shows the electrical configuration when the battery pack is attached to the charger.
Figure 6:
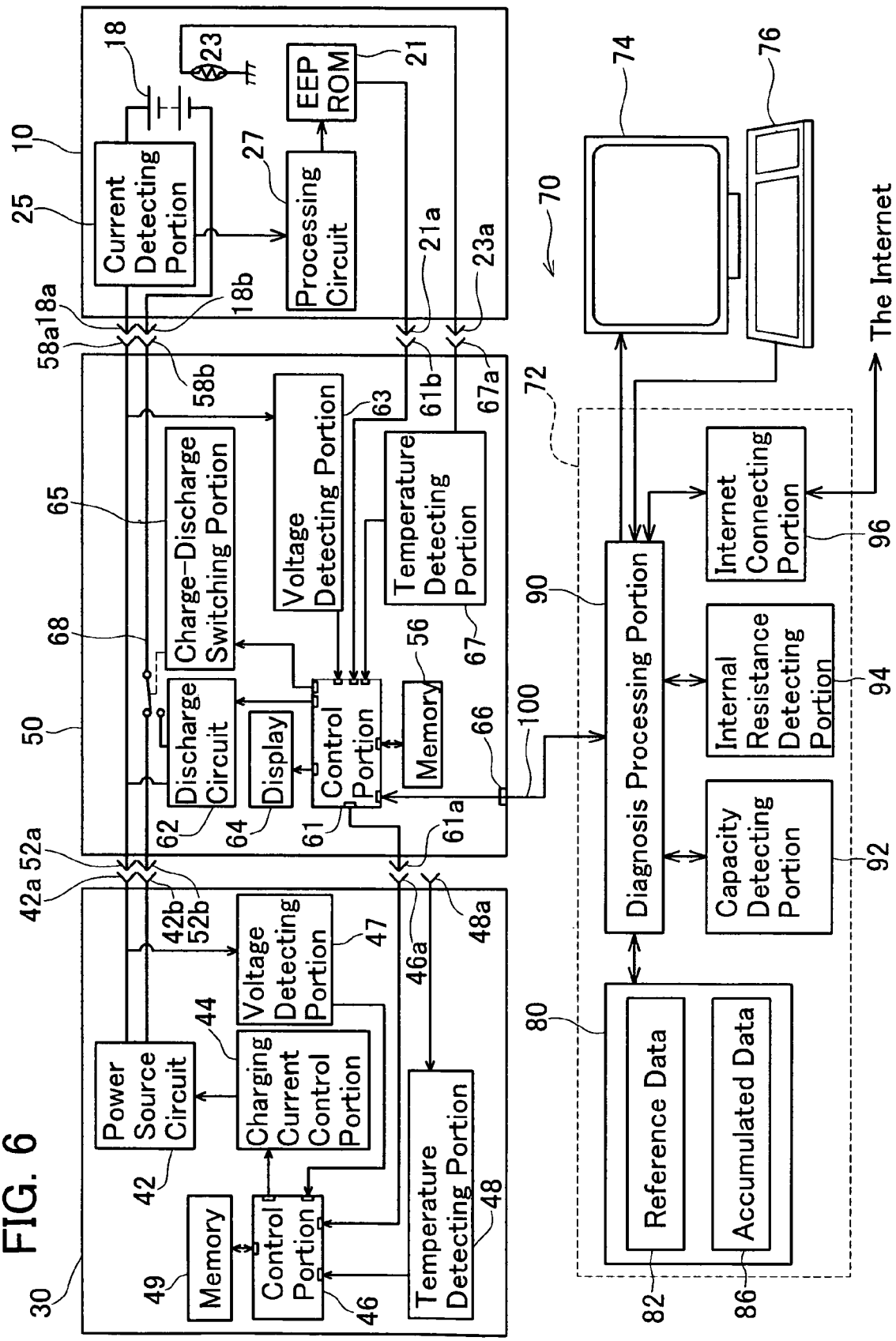
FIG. 6 shows the electrical configuration of the battery pack, the checking adaptor, and the charger.

FIG. 4 shows the external appearance of the checking adaptor 50. FIG. 5 shows circuit configuration when the battery pack 10 is attached directly to the charger 30, this showing the state when the charger 30 is charging the battery pack 10. FIG. 6 shows circuit configuration when the battery pack 10 is attached to the charger 30 with the checking adaptor 50 interposed therebetween, thus showing the state when the battery checking system 2 is diagnosing the battery pack 10.

First, the battery pack 10 will be described using FIG. 2 and FIG. 5. The battery pack 10 is a battery pack used in a power tool (for example, an impact driver). When the battery pack 10 is attached to the power tool, the battery pack 10 supplies power to a driving source (for example, a motor) of the power tool.

As shown in FIG. 2, the battery pack 10 has a substantially square-pillar shaped casing 11 made of resin. An upper side of the casing 11 is shaped such that it can fit, when attached thereto, with a corresponding power tool (for example, an impact driver or the like), the charger 30, or the checking adaptor 50.

The upper side of the casing 11 has a plus terminal groove 17, a minus terminal groove 19, and a connector 20. A plus terminal 18a (shown in FIG. 5) is provided within the plus terminal groove 17 and a minus terminal 18b (shown in FIG. 5) is provided within the minus terminal groove 19. A memory terminal 21a and a temperature sensor terminal 23a (both shown in FIG. 5) are provided within the connector 20. The terminals are formed such that they can make contact with corresponding receiving terminals and output terminals when the battery pack 10 is attached to the power tool, the charger 30, or the adaptor 50.

As shown in FIG. 5, a plurality of rechargeable batteries 18, an EEPROM 21, a temperature sensor 23, a current detecting portion 25, and a processing circuit 27 are housed within the casing 11 of the battery pack 10.

The rechargeable batteries 18 are connected in series as a plurality of rechargeable batteries 18. In the rechargeable batteries 18 of the present embodiment, ten nickel hydride batteries are connected in series.

The positive pole side of the rechargeable batteries 18 is connected with the plus terminal 18a via the current detecting portion 25. The negative pole side of the rechargeable batteries 18 is connected with the minus terminal 18b. In a fully-charged state, the voltage between the plus terminal 18a and the minus terminal 18b is approximately 12V.

The current detecting portion 25 detects the value of the charging current or the value of the discharging current of the rechargeable batteries 18, and sends this to the processing circuit 27. The processing circuit 27 calculates, over time, the remaining capacity of the rechargeable batteries 18 on the basis of the charging and discharging current values of the rechargeable batteries 18 that were sent, and sends this to the EEPROM 21.

The temperature sensor 23 is provided in the vicinity of the rechargeable batteries 18, and this temperature sensor 23 detects the temperature thereof. The temperature sensor 23 consists of a thermistor wherein current resistance varies in response to temperature. The temperature sensor 23 is connected with the temperature sensor terminal 23a.

The EEPROM 21, which stores electronic information, is provided within the casing 11. The EEPROM 21 is connected with the memory terminal 21a.

Data concerning the number of chargings (hereafter referred to as charging number data), history of remaining quantity of power data, history of temperature data, charging characteristics data, battery pack data, previous diagnostic data, etc. is stored in the EEPROM 21.

The number of chargings, the number of full chargings. etc. is stored in the charging number data. The number of chargings is the cumulative number of charging operations performed thus far on the battery pack 10. The number of full chargings is the cumulative number of charging operations performed on the battery pack 10 whereby a fully charged state was reached. The difference between the number of chargings and the number of full chargings shows the number of times in which, although charging of the battery pack 10 began, charging was halted before a fully charged state was reached.

The history of the remaining quantity of charged power in the rechargeable batteries 18 is stored in the history of remaining quantity data. The remaining quantity of charged power in the rechargeable batteries 18 is calculated by the processing circuit 27 and the processed data is sent to the EEPROM 21. The current detecting portion 25 detects current values for the rechargeable batteries 18 during discharging, and current values for the rechargeable batteries 18 during charging. On the basis of the charging and discharging current values detected by the current detecting portion 25, the processing circuit 27 adjusts the remaining quantity stored in the history of remaining quantity data while it stores the history of the remaining quantity. When the battery pack 10 is completely discharged by means of a refresh operation or the like, the remaining quantity values stored in the history of remaining quantity data may be reset to zero. By this means, accumulated errors can be removed.

The temperature history of the rechargeable batteries 18 during charging is stored in the history of temperature data. The charger 30 updates the history of temperature data when the charger 30 charges the battery pack 10. Since the rechargeable batteries 18 increase in temperature significantly when they are charged rapidly, if the temperature of the rechargeable batteries is high during charging it can be estimated that the rechargeable batteries 18 are being charged rapidly. All temperature values of the rechargeable batteries 18 during charging may be stored in the history of temperature data, or particular temperature values measures during charging may be extracted and stored, for example the highest temperature values, lowest temperature values, etc. In the present embodiment, all temperature values of the rechargeable batteries 18 measured during charging are stored.

Characteristics relating to the charging of the battery pack 10 are stored in the charging characteristics data. For example, a charging current suitable for the rechargeable batteries 18 of the battery pack 10, the frequency of the refresh operation suitable for the rechargeable batteries 18, etc. are stored.

The format of the battery pack 10, for example, is stored in the battery pack data. The format of the battery pack 10 is, for example, the classification, the nominal voltage, and the nominal charging/discharging capacity, etc. of the rechargeable batteries 18 within the battery pack 10. Further, identification data, etc. for distinguishing the battery pack 10 from other battery packs, is stored.

Information relating to previous diagnoses of the battery pack 10 performed by the battery checking system 2 is stored in the previous diagnostic data. The time of the previous diagnoses, the internal resistance values, charging/discharging capacity, and number of chargings of the rechargeable batteries 18 at the time of the previous diagnoses, and the diagnosis results, etc. of the battery checking system 2 at the time of the previous diagnoses are stored in the previous diagnostic data.

Next, the charger 30 will be described using FIG. 3 and FIG. 5. As shown in FIG. 1, the adaptor 50 can be attached to the charger 30 and, as shown in FIG. 3, the battery pack 10 can be attached directly to the charger 30. The charger 30 is used not only in the battery checking system 2, but is also used as a charger for charging the battery pack 10 during the normal use thereof.

As shown in FIG. 3, the charger 30 has a housing 31 made of resin. A connecting portion 32 is formed in a unified manner in an upper face of the housing 31, this connecting portion 32 being shaped such that it can be attached to the battery pack 10 and to the adaptor 50. Further, a variety of indicators 36 are provided in the housing 31, such as a status indicating lamp for indicating the operating status of the charger 30, etc.

Guides 33 and 34, these being capable of guiding the battery pack 10 and the adaptor 50, are provided in the connecting portion 32. A positive output terminal 42a and a minus output terminal 42b (shown in FIG. 5) are provided between the guides 33 and 34 of the connecting portion 32. Further, a connector (not shown) capable of making contact with the connector 20 of the battery pack 10 is provided, terminals 46a and 48a shown in FIG. 5 being located in the vicinity of this connector.

As shown in FIG. 5, a control circuit of the charger 30 is principally composed of a power source circuit 42, a charging-current controlling portion 44, a control portion 46, a voltage detecting portion 47, a temperature detecting portion 48, and a memory 49, etc.

The power source circuit 42 has an output capable of charging the rechargeable batteries 18 of the battery pack 10. The temperature detecting portion 48 is capable of detecting, from the output of the temperature sensor 23 of the battery pack 10, the temperature of the rechargeable batteries 18. The voltage detecting portion 47 is capable of detecting the voltage of the rechargeable batteries 18. Memory 49 stores current value controlling information based on a prescribed map or the like.

The above power source circuit 42, charging-current controlling portion 44, control portion 46, voltage detecting portion 47, temperature detecting portion 48, storage portion 49, etc. are virtually identical to the configuration of a charger described in an earlier patent filed by the present applicants (Japanese Laid-Open Patent Publication No. 2000-278875), and have a configuration for performing charging wherein the charging current is determined from the temperature of the rechargeable batteries 18 and values relating to the rate of change thereof. Memory 49 stores maps that store charging current values corresponding to the temperature of the rechargeable batteries and values relating to the rate of change thereof. A plurality of charging current maps are stored in memory 49, the map that is utilized being determined on the basis of the characteristics etc. of the rechargeable batteries to be charged.

As shown in FIG. 5, when the battery pack 10 is attached to the connecting portion 32 of the charger 30, the terminals 18a, 18b, 21a, and 23a provided on the battery pack 10 make electrical contact with, respectively, the terminals 42a, 42b, 46a, and 48a provided on the charger 30.

The control portion 46 reads the charging characteristics data from the EEPROM 21 of the battery pack 10, and utilizes a prescribed algorithm to control the power source circuit 42, the charging-current controlling portion 44, the voltage detecting portion 47, and the temperature detecting portion 48, etc. As a result, the rechargeable batteries 18 within the battery pack 10 are charged.

When charging begins, the control portion 46 sends a message to add 1 to the number of chargings of the charging number data stored in the EEPROM 21 of the battery pack 10.

During charging, the control portion 46 detects the temperature of the rechargeable batteries 18 and sends this to the history of temperature data stored in the EEPROM 21 of the battery pack 10.

Upon completion of charging, the termination of charging is indicated by means of a lamp or the like. The control portion 46 sends a message to add 1 to the number of full chargings of the charging number data stored in the EEPROM 21 of the battery pack 10.

Additionally, as will be described, the charger 30 is configured so as to be capable of performing all types of activities, such as charging etc., when the checking adaptor 50 has been attached to the charger 30, this charger 30 being under the control of the checking adaptor 50.

Next, the configuration of the checking adaptor 50 will be described with the aid of FIGS. 4 and 6. As shown in FIG. 4, the checking adaptor 50 has a casing 51 made of resin. A lower face of the casing 51 has a connecting portion 52 formed thereon, this connecting portion 52 being capable of fitting with the connecting portion 32 of the charger 30. An upper face of the casing 51 has a connecting portion 54 formed thereon, this connecting portion 54 being capable of fitting with the battery pack 10.

Further, a display 64 composed of a variety of lamps is provided on the upper face of the casing 51. The operating status of the charger 30, the operating status of the checking adaptor 50, etc. are indicated on the display 64.

The connecting portion 52 on the lower face of the casing 51 is provided with a positive receiving terminal 52a and a minus receiving terminal 52b (both shown in FIG. 6). Further, a connector (not shown) for connecting with a connector 20 of the charger 30 is provided, a terminal 61a (shown in FIG. 6) being located in the vicinity of this connector.

The connecting portion 54 on the upper face of the casing 51 is provided with a positive output terminal 58a and a minus output terminal 58b (both shown in FIG. 6). Further, a connector (not shown) for connecting with the connector 20 of the battery pack is provided, terminals 61b and 67a (both shown in FIG. 6) being located in the vicinity of this connector.

A communication terminal 66 (shown in FIG. 6) is provided on a rear face of the casing 51. As shown in FIG. 6, the communication cable 100 is connected with the communication terminal 66. The checking adaptor 50 and the computer 70 are connected by means of this communication cable 100.

As shown in FIG. 6, a control circuit of the checking adaptor 50 is principally composed of a control portion 61, a discharge circuit 62, a voltage detecting portion 63, the display 64, a temperature detecting portion 67, a relay 68, and a charge-discharge switching portion 65 for controlling the relay 68, etc. The control circuit operates using power supplied by the charger 30.

The discharge circuit 62 comprises a resistance, or the like, that functions as a load while the rechargeable batteries 18 are discharged. The discharging current can be adjusted, on the basis of commands from the control portion 61, by adjusting the load resistance values of the discharge circuit 62.

The voltage detecting portion 63 is configured so as to be capable of detecting the voltage of the rechargeable batteries 18. The voltage detecting portion 63 detects the voltage of the rechargeable batteries 18 and sends this to the control portion 61.

The charge-discharge switching portion 65 switches the relay 68 on the basis of commands from the control portion 61. By this means, the rechargeable batteries 18 of the battery pack 10 are connected with the power source circuit 42 of the charger 30 or with the discharge circuit 62 of the checking adaptor 50.

The temperature detecting portion 67 is capable of detecting, through the use of the output of the temperature sensor 23 of the battery pack 10, the temperature of the rechargeable batteries 18. The temperature detecting portion 67 detects the temperature of the rechargeable batteries 18 and sends this to the control portion 61.

The control portion 61 of the checking adaptor 50 has a communicating function, and communicates information with the control portion 46 of the charger 30 and with the computer 70. Furthermore, the control portion 61 is capable of reading information from the EEPROM 21 of the battery pack 10 and writing information to the EEPROM 21.

As shown in FIG. 6, when the checking adaptor 50 is attached to the charger 30, the terminals 52a, 52b, and 61a provided on the checking adaptor 50 make electrical contact with, respectively, the terminals 42a, 42b, and 46a provided on the charger 30. Further, when the checking adaptor 50 is attached to the battery pack 10, the terminals 58a, 58b, 61b, and 67a provided on the checking adaptor 50 make electrical contact with, respectively, the terminals 18a, 18b, 21a, and 23a provided on the battery pack 10.

When the charger 30, the checking adaptor 50, and the battery pack 10 are connected in sequence, the control portion 61 of the checking adaptor 50 is capable of reading information stored in the EEPROM 21 of the battery pack 10. Further, the control portion 61 is capable of giving commands to the control portion 46 of the charger 30, the discharge circuit 62, or the charge/discharge switching portion 65, etc., thereby charging or discharging the rechargeable batteries 18. For example, the control portion 61 is capable of fully charging the rechargeable batteries 18 after having fully discharged them, thereby performing a refresh operation on the rechargeable batteries.

Next, the configuration of the computer device 70 will be described utilizing FIG. 6. The computer device 70 is composed of a computer main body 72, a display 74, an input device 76, etc.

As shown in FIG. 6, the computer main body 72 is composed of a storage portion 80 for storing data, etc. utilized in various types of processes, a diagnosis processing portion 90 for performing processes relating to the diagnosis of the battery pack 10, a capacity detecting portion 92 for detecting the charging/discharging capacity of the rechargeable batteries 18, an internal resistance detecting portion 94 for calculating the internal resistance of the rechargeable batteries 18, and an internet connecting portion 96, etc. The storage portion 80, the diagnosis processing portion 90, the capacity detecting portion 92, the internal resistance detecting portion 94, the internet connecting portion 96, etc. comprise the hardware, software, etc. of the computer main body 72.

Reference data 82 is stored in the storage portion 80. A reference degradation map 120 relating to internal resistance (shown in FIG. 7) and a reference activity map 140 (shown in FIG. 8), etc. are stored in the reference data 82.

Figure 7:
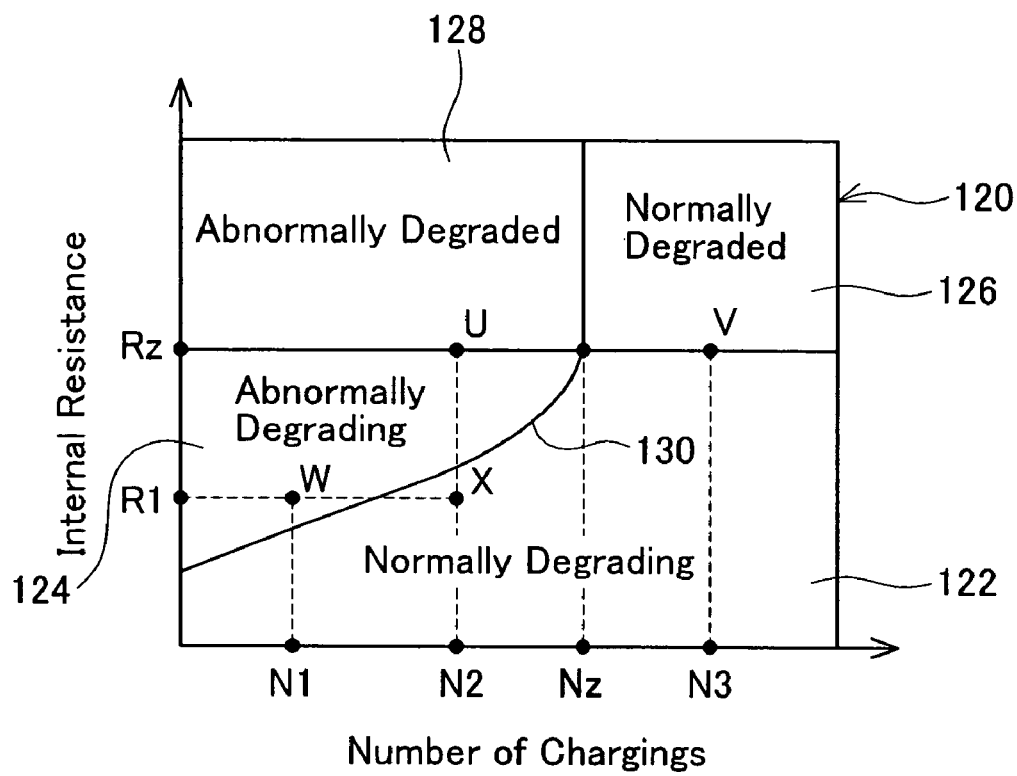
FIG. 7 shows an example of a reference degradation map relating to internal resistance.

As shown in FIG. 7, the reference degradation map 120 relating to internal resistance is a two-dimensional map wherein the number of chargings is indicated on the horizontal axis and internal resistance is indicated on the vertical axis. The reference degradation map 120 has a normally degrading region 122, an abnormally degrading region 124, a normally degraded region 126, and an abnormally degraded region 128, these being determined on the basis of the relationship between number of chargings and internal resistance. A curved line 130 that separates the normally degrading region 122 and the abnormally degrading region 124 shows the standard relationship between number of chargings and internal resistance of the degrading rechargeable batteries 18 in the case where the manufacture and use of the battery pack 10 is normal. An internal resistance value Rz shown in the figure is a degradation reference resistance value Rz. The rechargeable batteries 18 can be determined to have degraded to a limit stage, at which they cannot be utilized, when the internal resistance thereof increases so as to be greater than this internal resistance value Rz. Further, the number of chargings Nz is a reference number of chargings Nz. When the rechargeable batteries 18 have been utilized normally, the internal resistance thereof is predetermined not to be greater than the degradation reference resistance value Rz at this reference number of chargings Nz.

The normally degrading region 122 is a region wherein internal resistance relative to the number of chargings is equal to or below the standard value, this shows that the rechargeable batteries 18 are degrading normally relative to the number of chargings. The abnormally degrading region 124 is a region wherein internal resistance relative to the number of chargings is above the standard value, this shows that the rechargeable batteries 18 are degrading abnormally relative to the number of chargings. The normally degraded region 126 is a region wherein the number of chargings is equal to or above the reference number of chargings Nz and internal resistance is equal to or above the degradation reference resistance value Rz, this shows that the rechargeable batteries 18 have degraded normally to a stage at which they cannot be utilized. The abnormally degraded region 128 is a region wherein the number of chargings is less than the reference number of chargings Nz and internal resistance is equal to or above the degradation reference resistance value Rz, this shows that the rechargeable batteries 18 have degraded abnormally to a stage at which they cannot be utilized.

Figure 8:
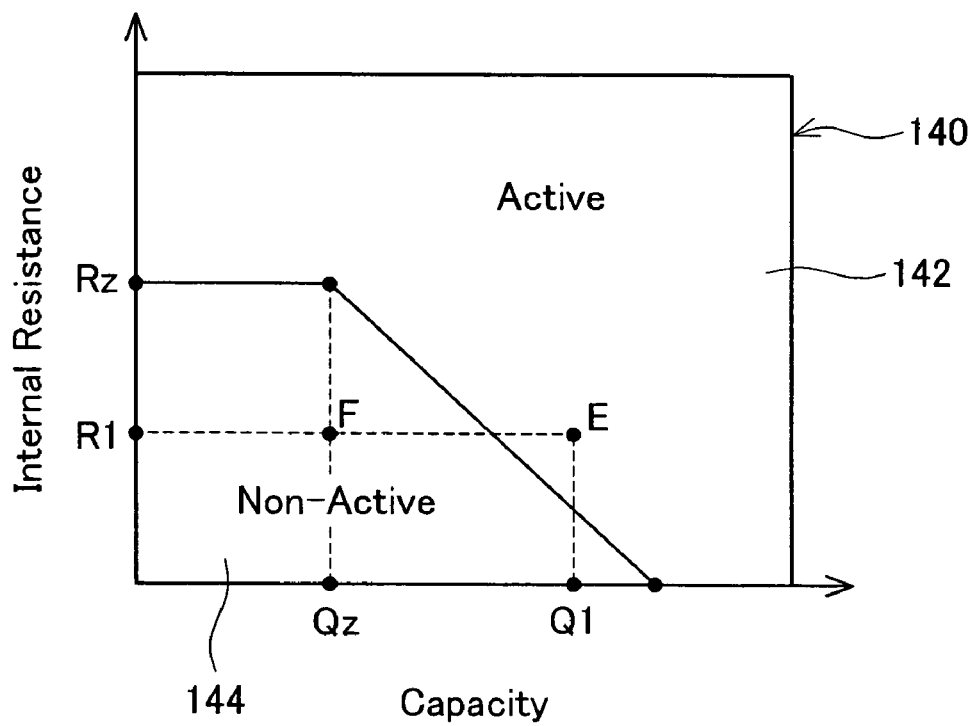
FIG. 8 shows an example of a reference activity map.

As shown in FIG. 8, the reference activity map 140 is a two-dimensional map wherein the charging/discharging capacity is indicated on the horizontal axis and internal resistance is indicated on the vertical axis. The reference activity map 140 has an active region 142 and a non-active region 144, these being determined on the basis of the relationship between the charging/discharging capacity and the internal resistance of the rechargeable batteries 18. The non-active region 144 is a region wherein the charging/discharging capacity is small and internal resistance is low.

In rechargeable batteries in which degradation has not progressed, the charging/discharging capacity has barely decreased and the internal resistance has barely increased. However, in rechargeable batteries in which degradation has progressed, charging/discharging capacity has fallen, and internal resistance has increased. By contrast, when the rechargeable batteries 18 are in a non-active state, charging/discharging capacity has fallen, while internal resistance has barely increased. Consequently, it is possible to determine that rechargeable batteries are in a non-active state when their charging/discharging capacity has decreased and their internal resistance has barely increased. As a result, as shown in FIG. 8, in the two-dimensional map wherein the charging/discharging capacity is indicated on the horizontal axis and internal resistance is indicated on the vertical axis, it is possible to determine that the region in which the charging/discharging capacity is low and internal resistance is low is the non-active region. The charging/discharging capacity value Qz shown in the figure is the degradation reference capacity value Qz. It can be determined that the rechargeable batteries 18 have degraded when their charging/discharging capacity is lower than the charging/discharging capacity value Qz. As in the aforementioned description of FIG. 7, when the rechargeable batteries 18 have degraded, their internal resistance increases to be greater than the degradation reference resistance value Rz. That is, it has been predetermined that the internal resistance of the rechargeable batteries 18 will have increased to the degradation reference resistance value Rz when the charging/discharging capacity of the rechargeable batteries 18 has decreased to the degradation reference capacity value Qz. Furthermore, it has been predetermined that the number of chargings at this juncture will be the reference number of chargings Nz.

As shown in FIG. 6, accumulated diagnostic information data 86 is stored in the storage portion 80 of the computer 70. Diagnostic information concerning the battery pack 10 that has been diagnosed by the battery checking system 2 is accumulated and stored in the accumulated diagnostic information data 86. For example, the data read from the EEPROM 21 of the battery pack 10, the data calculated at the time of diagnosis, data input by the user, etc. are stored in the accumulated diagnostic information data 86.

The capacity detecting portion 92 is capable of detecting the charging/discharging capacity of the rechargeable batteries 18. Specifically, the capacity detecting portion 92 extracts the most recent maximal value from the history of remaining quantity data stored in the EEPROM 21 of the battery pack 10, thereby detecting the charging/discharging capacity of the rechargeable batteries 18.

The internal resistance detecting portion 94 is capable of calculating internal resistance values for the rechargeable batteries 18, these being calculated from the voltage values of the rechargeable batteries 18 measured when the batteries were being charged or discharged. For example, the internal resistance detecting portion 94 is capable of calculating the internal resistance from the voltage values of the rechargeable batteries 18 when the batteries are in a non-conducting state, and from the voltage values measured when the rechargeable batteries 18 are being discharged using a prescribed current.

The internet connecting portion 96 is capable of connecting the computer 70 with the internet When connected with the internet by means of the internet connecting portion 96, the computer device 70 is capable of exchanging electronic information with external computer devices, etc.

The configuration of the battery checking system 2 of the present embodiment was described above. Next, the operation sequence of the battery checking system 2 will be described with reference to the flowchart shown in FIG. 9.

At step S2, the battery pack 10 is in a waiting state prior to being attached to the checking adaptor 50. Detection of battery pack 10 attachment can be achieved by, for example, the voltage detecting portion 63 detecting the voltage of the rechargeable batteries 18.

At step S4, the control portion 61 of the checking adaptor 50 reads information from the EEPROM 21 of the battery pack 10. The control portion 61 sends the information read from the EEPROM 21 to the diagnosis processing portion 90 of the computer device 70. The control portion 61 of the checking adaptor 50 and the diagnosis processing portion 90 of the computer device 70 detect, for example, the number of chargings, etc. of the rechargeable batteries 18 from the charging number data, the history of remaining quantity data, the history of temperature data, the charging characteristics data, or the battery pack data of the battery pack 10.

At step S6, the charging/discharging capacity of the rechargeable batteries 18 is detected. The history of remaining quantity data of the battery pack 10 is sent from the diagnosis processing portion 90 to the capacity detecting portion 92, the capacity detecting portion 92 extracts the most recent maximal value from the history of remaining quantity data and thereby detects the charging/discharging capacity of the rechargeable batteries 18. Moreover, the method for detecting the charging/discharging capacity of the rechargeable batteries is not limited to the method described above. Instead, other methods may also be utilized. For example, the rechargeable batteries 18 may be fully charged after being fully discharged, and the charged quantity of power at that juncture may be measured.

At step S8, the internal resistance of the rechargeable batteries 18 is detected. The diagnosis processing portion 90, controlled by the control portion 61 of the checking adaptor 50, performs diagnostic charging and discharging of the rechargeable batteries 18. During this diagnostic charging and discharging, the voltage values of the rechargeable batteries 18 are detected by the voltage detecting portion 63 of the checking adaptor 50, and are sent to the internal resistance detecting portion 94 via the control portion 61 and the diagnosis processing portion 90. The internal resistance detecting portion 94 calculates the internal resistance of the rechargeable batteries 18 from the voltage values of the rechargeable batteries 18 relative to the diagnostic charging and discharging.

The number of chargings, the charging/discharging capacity, the internal resistance, etc. of the rechargeable batteries 18 is detected by means of steps S4, S6, and S8 described above.

Figure 9:
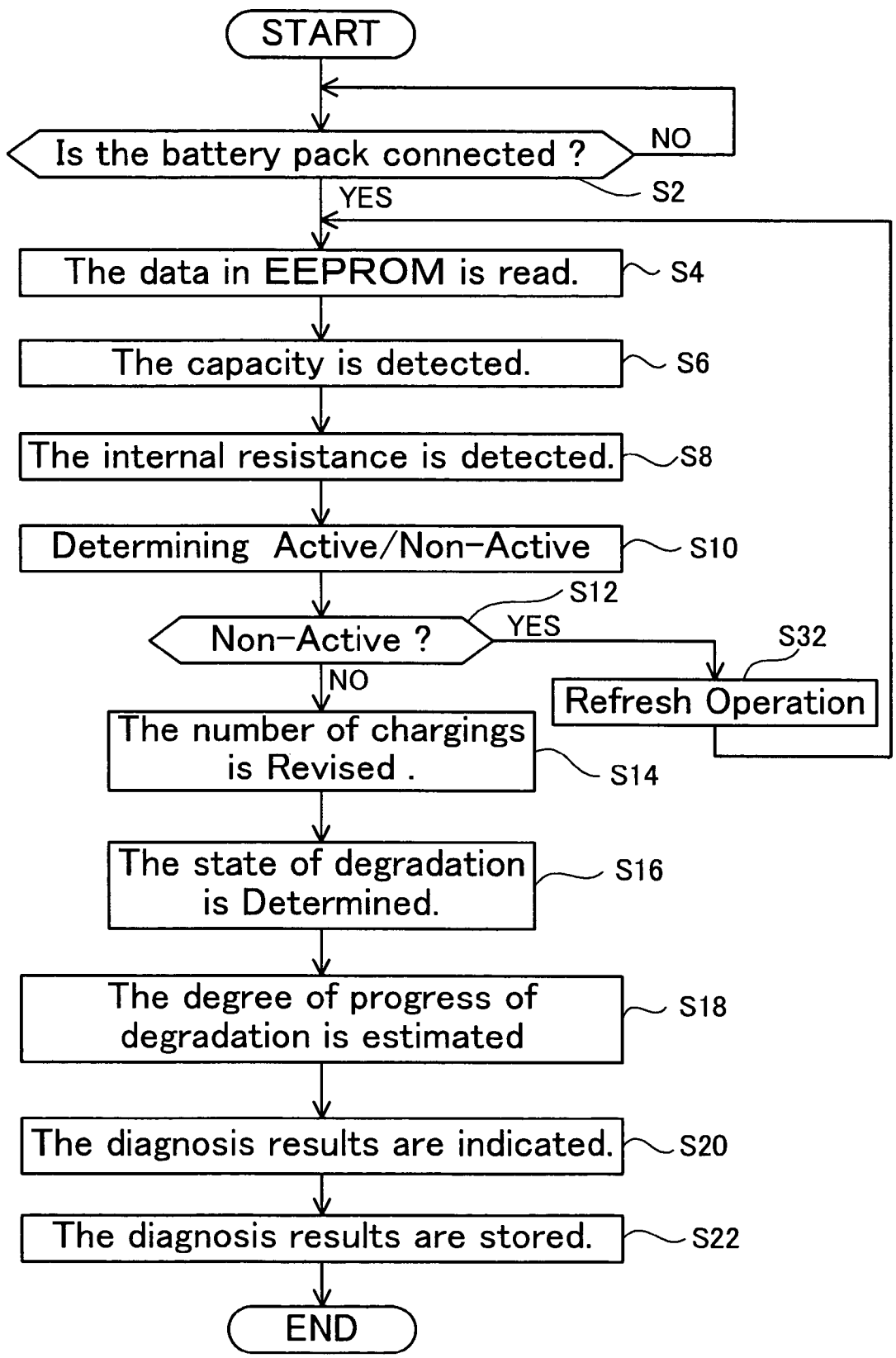
FIG. 9 is a flowchart showing the sequence of operation of the battery checking system.

At step S10, shown in FIG. 9, a determining process is performed to determine whether the rechargeable batteries 18 are in an active state or a non-active state. The diagnosis processing portion 90 plots, on the reference activity map 140 (FIG. 8), the value of the charging/discharging capacity detected during step S6 relative to the internal resistance measured at step S8, and determines whether the rechargeable batteries 18 are in an active state or a non-active state.

As shown in FIG. 8, when the detected charging/discharging capacity is equal to Q1 and the detected internal resistance is equal to R1, it is determined that the rechargeable batteries 18 are in an active state. However, when for example the detected charging/discharging capacity is equal to the degradation reference capacity value Qz, and the detected internal resistance is equal to the internal resistance value R1, it is determined that the rechargeable batteries 18 are in a non-active state. If the determination was made using only the charging/discharging capacity, it would have been determined that the rechargeable batteries 18 had degraded when the charging/discharging capacity became equal to the degradation reference capacity value Qz. However, in contrast the battery checking system 2, the determination is made by combining the charging/discharging capacity and the internal resistance, and consequently it is possible to determine that the rechargeable batteries 18 are in a non-active state.

At step S12, the process continues to step S14 if it was determined at step S10 that the rechargeable batteries 18 are in an active state, and the process progresses to step S32 if it was determined at step S10 that the rechargeable batteries 18 are in a non-active state.

In the case where the process progresses to step S32, a refresh operation of the rechargeable batteries 18 is performed at step S32. When the diagnosis processing portion 90 determines that the rechargeable batteries 18 are in a non-active state, the diagnosis processing portion 90 commands the control portion 61 of the checking adaptor 50 to perform a refresh operation on the rechargeable batteries 18. When this command is received, the control portion 61 of the checking adaptor 50 gives commands to the control portion 46 of the charger 30, the discharge circuit 62, the charge-discharge switching portion 65, etc., and a refresh operation is performed on the rechargeable batteries 18. After the refresh operation has been performed, the process returns to step S4. The history of remaining quantity data, following the refresh operation, is read from the EEPROM 21 of the battery pack 10 at step S4, and the charging/discharging capacity of the rechargeable batteries 18 after the refresh operation is detected at step S6. In this manner, in the battery checking system 2, when the rechargeable batteries 18 are in a non-active state, the temporarily reduced charging/discharging capacity is restored and then the diagnosing process is performed on the rechargeable batteries 18.

At step S14 of FIG. 9, the number of chargings of the battery pack 10 detected in step S4 is revised on the basis of the history of use of the battery pack 10. In the present embodiment, the history of use of the battery pack 10 is estimated from the history of remaining quantity data and the history of temperature data read at step S4. The diagnosis processing portion 90 counts, using the history of remaining quantity data, the number of times that the remaining quantity of the rechargeable batteries 18 has fallen below a predetermined lower limit value. This number correlates to the number of times that the rechargeable batteries 18 have been over discharged. Furthermore, the diagnosis processing portion 90 counts, using the history of temperature data, the number of times that the temperature of the rechargeable batteries 18 has risen above a predetermined upper limit value. This number is equal to the number of times that the rechargeable batteries 18 have been charged too rapidly. The diagnosis processing portion 90 calculates, based on the number of times the rechargeable batteries 18 have been over discharged and the number of times the rechargeable batteries 18 have undergone over-rapid charging, the frequency of occurrence of over discharge and over-rapid charging, and revises the detected number of chargings upwards in accordance with this frequency of occurrence. By revising the number of chargings in this manner, the rechargeable batteries 18 that have been repeatedly used in a manner that fosters their degradation are evaluated as having been charged a greater number of times than the actual number of chargings.

At step S16, a determining process is performed to determine the state of degradation of the rechargeable batteries 18. Specifically, it is determined whether the rechargeable batteries 18 have degraded to a stage at which they cannot be utilized. When the rechargeable batteries 18 have degraded to a stage at which they cannot be utilized, it is determined whether the rechargeable batteries 18 have degraded normally or abnormally. If the rechargeable batteries 18 are still in a state in which they can be utilized, it is determined whether the rechargeable batteries 18 are degrading normally or abnormally.

The diagnosis processing portion 90 plots, on the reference degradation map 120 (FIG. 7), the revised number of chargings determine for the rechargeable batteries 18 that was at step S14, and the values relative to the internal resistance of the rechargeable batteries 18 that were detected at step S8, and thus determines the state of degradation of the rechargeable batteries 18. As shown in FIG. 7, when, for example, a point such as U is plotted in the abnormally degraded region 128, it is determined that the rechargeable batteries 18 have degraded to a stage at which they cannot be utilized and that this degradation was abnormal. When a point, such as V, is plotted in the normally degraded region 126, it is determined that the rechargeable batteries 18 have degraded to a stage at which they cannot be utilized and that this degradation was normal. When a point, such as W, is plotted in the abnormally degrading region 124, it is determined that the rechargeable batteries 18 are still in a state in which they can be utilized, and it is determined that degradation is proceeding abnormally. When a point, such as X, is plotted in the normally degrading region 122, it is determined that the rechargeable batteries 18 are in a state in which they can be utilized, and it is determined that degradation is proceeding normally.

At step S18, the degree of degradation progress for the rechargeable batteries 18 is estimated. The degree of degradation progress is the extent to which the rechargeable batteries 18 have degraded at that juncture, relative to a state in which utilization is not possible. For example, if the degree of degradation progress is 50 percent, the rechargeable batteries 18 will degrade to the state in which utilization is not possible when they have been further used to the same extent as had been used up until that point.

Figure 10:
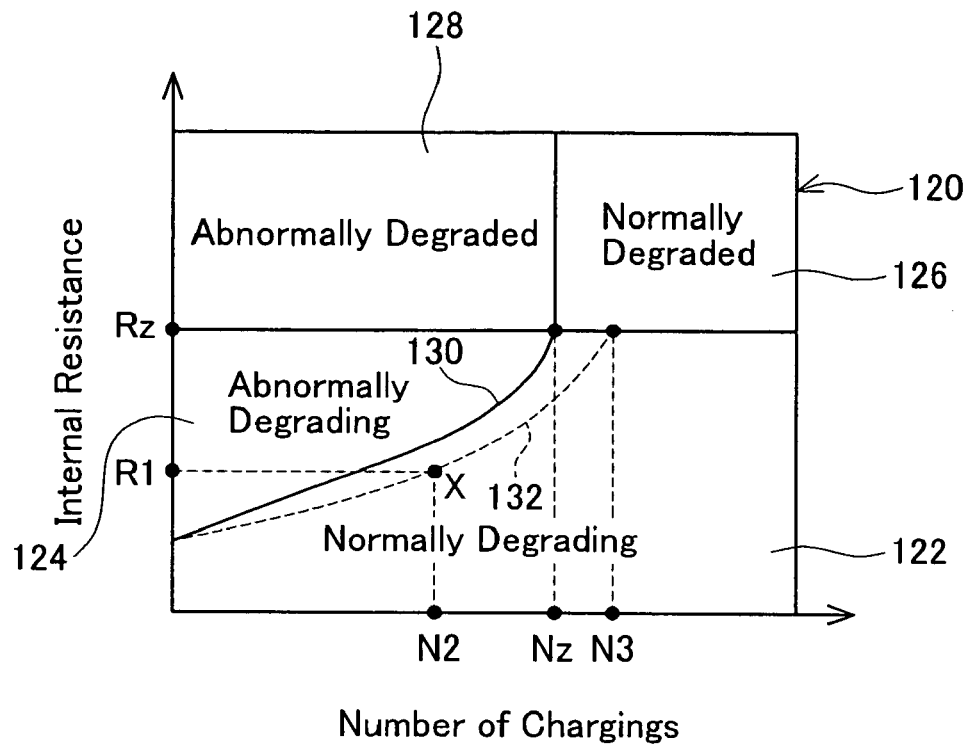
FIG. 10 shows a process for estimating, from the transition of internal resistance, the degree of progress of degradation.

The process for estimating the degree of degradation progress, this being performed by the diagnosis processing portion 90, will be described with reference to FIG. 10. As shown in FIG. 10, the diagnosis processing portion 90 plots, on the internal resistance reference degradation map 120 shown in FIG. 7, the value of the pair consisting of the number of chargings of the rechargeable batteries 18 that was detected at step S4 and internal resistance of the rechargeable batteries 18 that was detected at step S8. Here, a case is described in which the point X is plotted. Furthermore, it should be noted that the number of chargings used in this process is the original number of chargings not the revised number of chargings determined during step S14. Using the plotted point X and the standard relationship curved line 130 stored in the internal resistance reference degradation map 120, the diagnosis processing portion 90 creates, on the internal resistance reference degradation map 120, a curved line of transitions 132 showing the number of chargings and the internal resistance from that time onwards. In the curved line of transitions 132, a number of chargings N3 is found at which the internal resistance exceeds the degradation reference resistance value Rz. That is, when the number of chargings of the rechargeable batteries 18 becomes N3, the internal resistance will have increased as far as the degradation reference resistance value Rz, and it is estimated that the rechargeable batteries 18 will have degraded to a stage at which they cannot be utilized. The diagnosis processing portion 90 finds, based on the difference between the number of chargings N2 of that juncture and the estimated degradation number of chargings N3, the degree of degradation progress.

Figure 12:
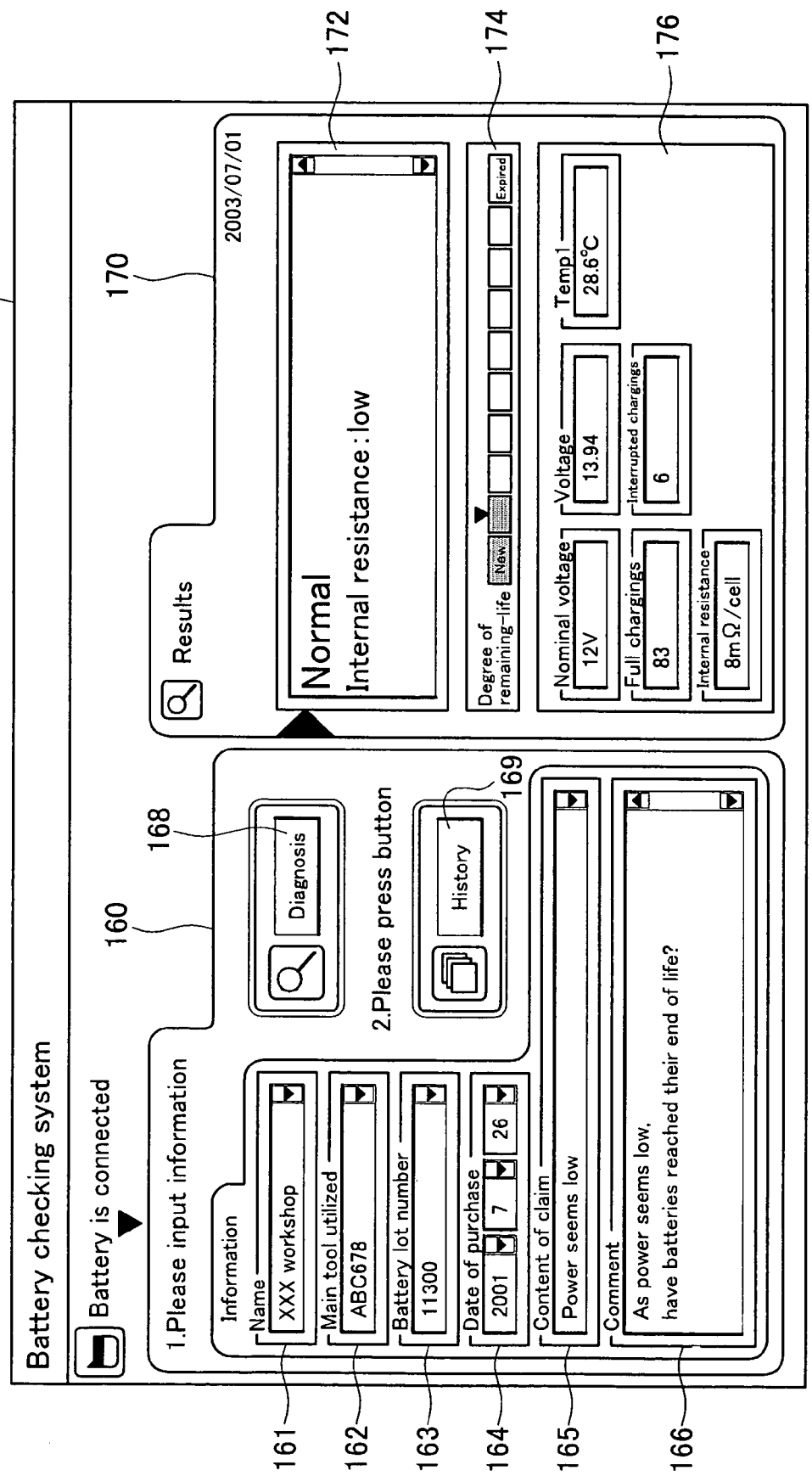
FIG. 12 shows an example of diagnostic results appearing on a display.

At step S20, the determined results, etc. of the above processes are indicated on the display 74. FIG. 12 shows an example of a display screen 150 displayed by the display 74. As shown in FIG. 12, the display screen 150 is composed chiefly of an input display 160 and a result display 170. The input display 160 displays information and enables the user to input information and give commands to the battery checking system 2. For example, with reference to the battery pack 10, the user can input: the equipment owner (161 in the figure), the model of equipment (power tool, etc.) utilized (162 in the figure), the production lot number (163), the date of purchase (164), a user evaluation (165), and the aim of the present diagnosis (166).

A diagnosis execution button 168 and a history display button 169 are displayed on the input display 160, these buttons allow the user to give instructions to the battery checking system 2. A command to perform the diagnosing process of the battery pack 10 can be given to the battery checking system 2 by means of the diagnosis execution button 168. Furthermore, the diagnosing process of the battery pack 10 is begun, as described above, by connecting the battery pack 10 with the checking adaptor 50 (step S2). The diagnosis execution button 168 is utilized in cases where the battery pack 10 has already been connected, etc, such as the case where the same battery pack 10 is to be diagnosed continuously. The accumulated diagnostic information data 86 stored in the storage portion 80 and concerning the previous diagnostic information of the battery pack 10 can be displayed on the result display 170 by means of the history display button 169.

The result display 170 displays the diagnosis results concerning the battery pack 10, and is composed of a diagnostic result comment display 172, a remaining-life display 174, and a detecting-value display 176. Comments based on the determined results from step S10 concerning active/non-active, and based on the determined results from step S16 concerning state of degradation are displayed in the diagnostic result report display 172. If 'normally degrading' is diagnosed in step S16, for example, 'Normal' or the like will be displayed as shown in FIG. 12.

The degree of degradation progress estimated in step S18 is displayed in the remaining-life display 174. Various values detected during the diagnosing process are displayed in the detected-value display 176. For example, the nominal voltage values of the rechargeable batteries 18, the detected actual voltage values of the rechargeable batteries 18, the temperature of the rechargeable batteries 18 detected by the temperature sensor 23, etc. are displayed. Further, the number of chargings read from the EEPROM 21, the detected internal resistance values, etc. of the rechargeable batteries 18 are also displayed.

Figure 13:
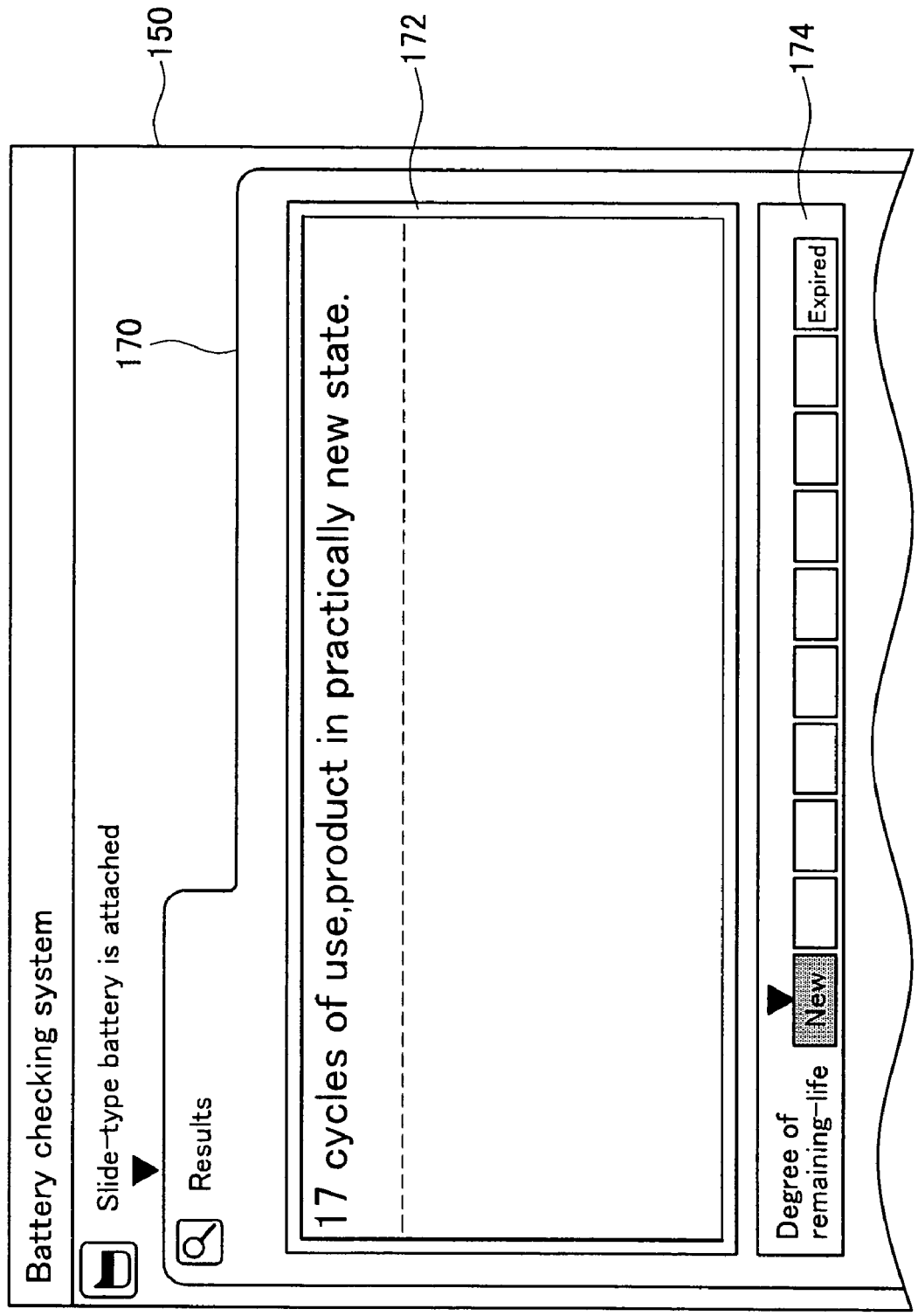
FIG. 13 shows an example of diagnostic results (of a product in initial stages of use) appearing on the display.

FIGS. 13, 14, 15, and 16 show example notifications which can be shown on the result display 170. FIG. 13 shows an example notification wherein the state of degradation of the rechargeable batteries 18 was determined to be in the 'normally degrading' and the number of chargings was also small, and the battery pack 10 was diagnosed to be new. Performing diagnosis on the battery pack 10 when use has recently begun is effective for recognizing whether an early failure has occurred due to manufacturing issues, or for similar reasons.

Figure 14:
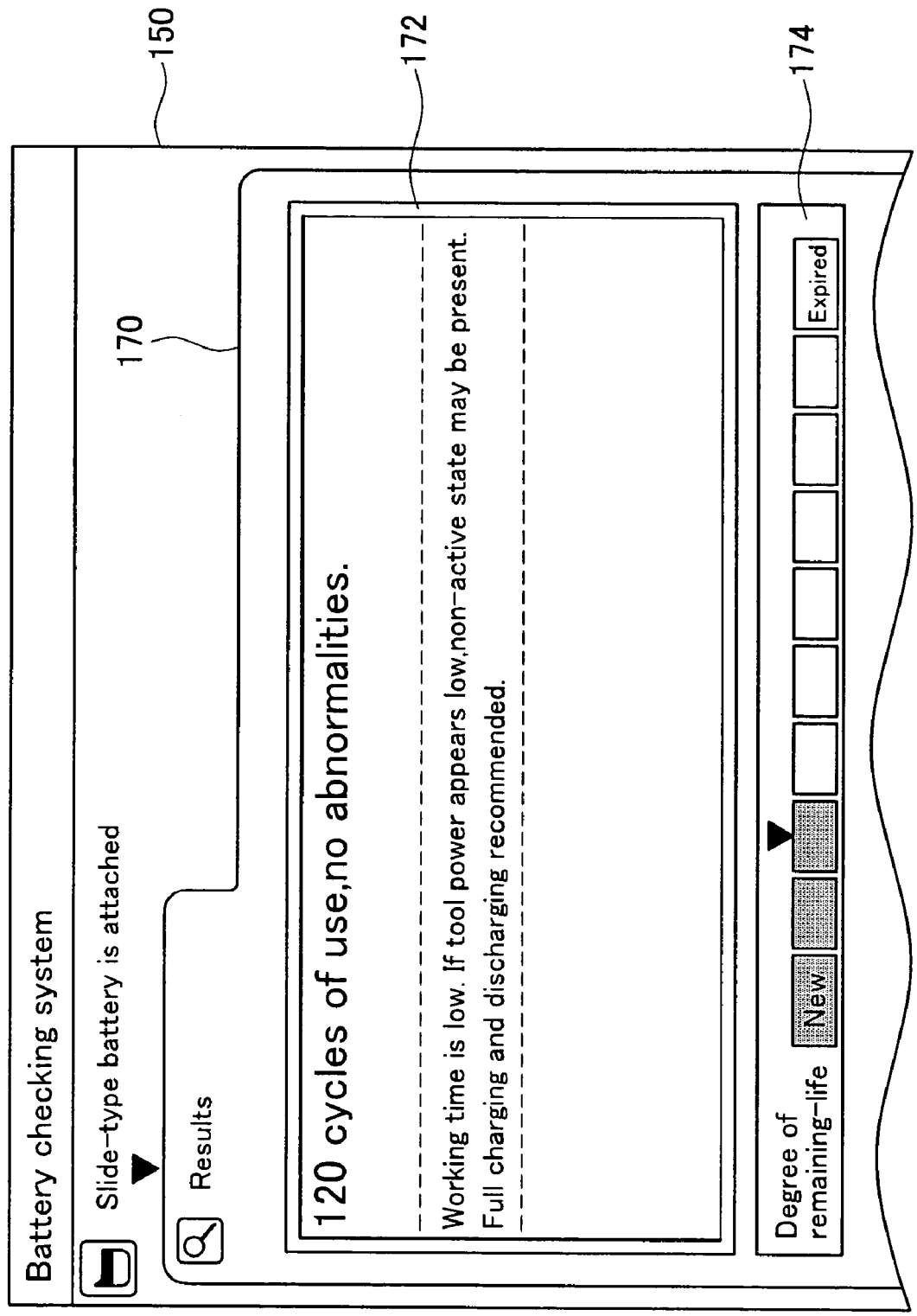
FIG. 14 shows an example of diagnostic results (of a non-active state) appearing on the display.

FIG. 14 shows an example notification wherein the state of degradation of the rechargeable batteries 18 was determined to be 'non-active' when active/non-active state was determined in step S10, and was determined to be 'normally degrading' after the refresh operation. As shown in FIG. 14, in the case where the rechargeable batteries 18 were determined to be in a non-active state, a comment may be added recommending a complete charging and discharging, etc. as a refresh operation.

Figure 15:
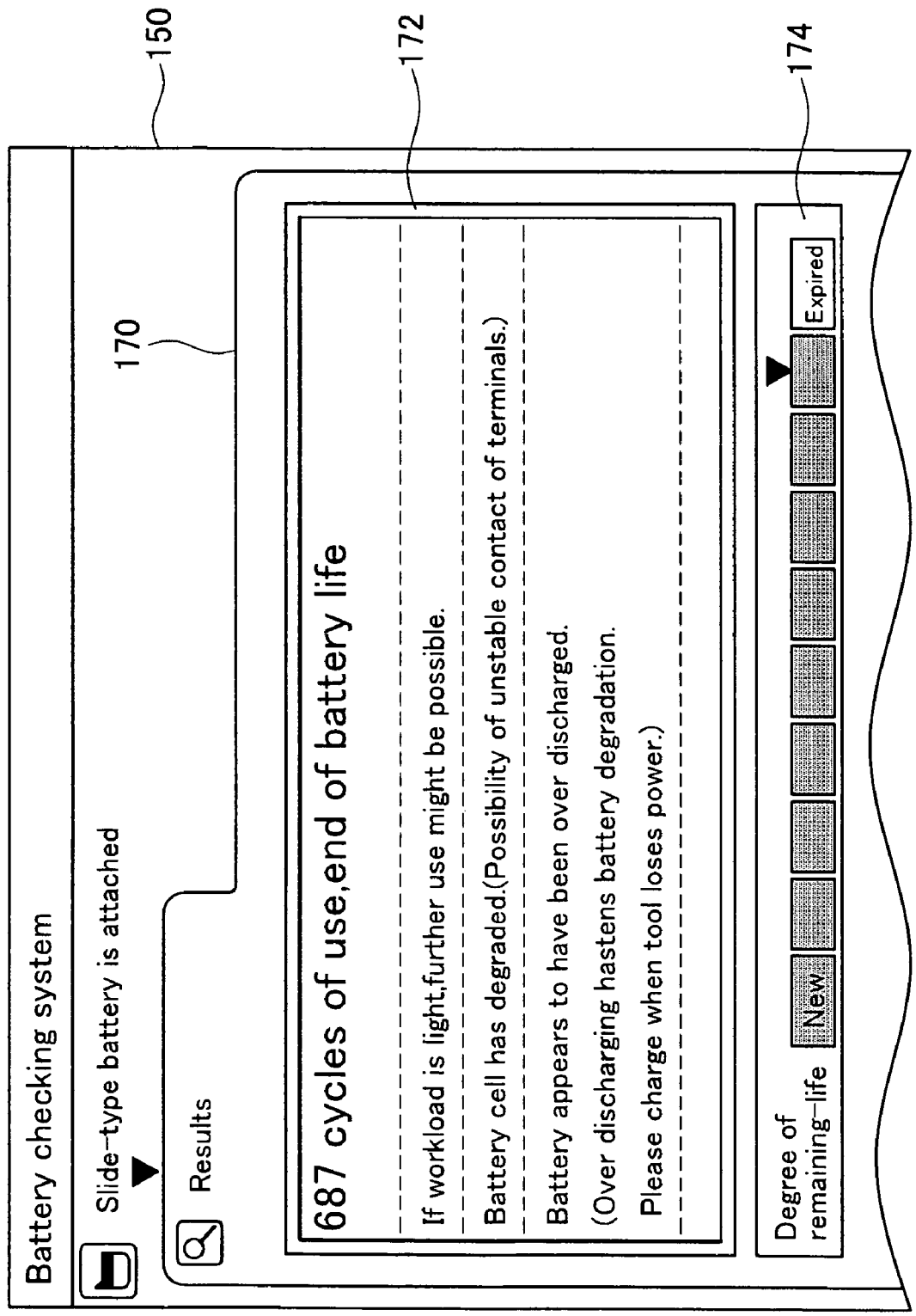
FIG. 15 shows an example of diagnostic results (of a product wherein degradation is completed) appearing on the display.

FIG. 15 shows an example notification wherein the state of degradation of the rechargeable batteries 18 was determined to be 'normally degraded'. In this case where it is ascertained, from the history of remaining quantity data stored in the EEPROM 21 of the battery pack 10, that over discharging has frequently occurred, the user of the battery pack 10 may be advised, as in FIG. 15, that 'Over discharging hastens battery degradation. Please charge when tool loses power'.

Figure 16:
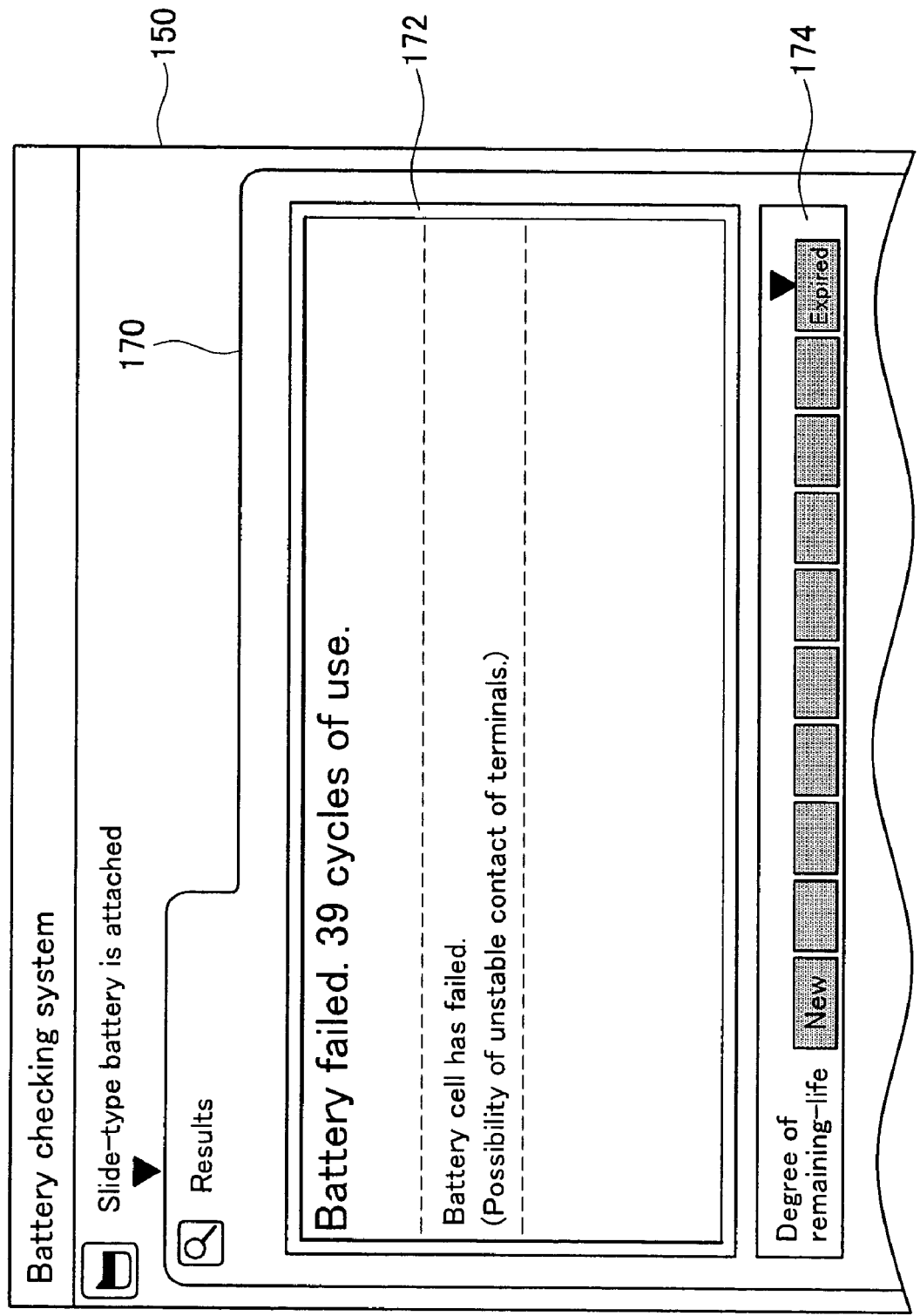
FIG. 16 shows an example of diagnostic results (of a defect product) appearing on the display.

FIG. 16 shows an example notification wherein the state of degradation of the rechargeable batteries 18 was determined to be 'abnormally degraded'. In this case, where the degradation of the rechargeable batteries 18 is abnormal and the number of chargings is low, failure of the battery pack 10 can be assumed to have occurred. In a case where failure of the battery pack 10 is suspected, a notification is given as shown in FIG. 16, so as to prevent the continued use of the failed battery pack 10.

At step S22 of FIG. 9, the present diagnosis results are added to the accumulated diagnostic information data 86 stored in the storage portion 80. Here, the term 'diagnosis results' includes data read from the EEPROM 21 of the battery pack 10, change patterns in the detected voltage or temperature of the rechargeable batteries 18, calculated charging/discharging capacity values and the internal resistance values of the rechargeable batteries 18, determined results concerning the state of degradation, and information that was input by the user by means of the input display 160. The battery checking system 2 is capable of reading the diagnostic information stored in the accumulated diagnostic information data 86 and, as shown in FIGS. 12 to 16, displaying the diagnosis results' display screen 150 on the display 74 at any time. Furthermore, the battery checking system 2 is capable of reading the previous diagnostic data stored in the EEPROM 21 of the battery pack 10 and displaying this on the display 74.

Moreover, at step S22, the present diagnosis results are written to the EEPROM 21 of the battery pack 10. Since the present diagnosis results are stored in the EEPROM 21 of the battery pack 10, the present diagnostic information can be displayed even when the battery pack 10 is diagnosed by a different battery checking system 2.

The battery checking system 2 performs diagnosis of the rechargeable batteries 18 in the sequence described above. The battery checking system 2 is capable of determining whether the rechargeable batteries 18 are degrading normally or abnormally in relation to the number of chargings. By this means, it is possible to prevent the continued use of a failed battery pack 10 and thereby prevent secondary failures such as damage to electrical equipment.

Furthermore, the battery checking system 2 is capable of estimating the degree to which the rechargeable batteries 18 have degraded relative to the end-life thereof. It is also possible to estimate the period of time that the rechargeable batteries 18 will last before the rechargeable batteries 18 degrade to a stage at which they cannot be utilized, this allows the user of the rechargeable batteries 18 to alter plans for future use of the battery pack 10.

Moreover, the battery checking system 2 is capable of estimating whether the battery pack 10 is being used in a manner that hastens the degradation of the rechargeable batteries 18. As a result, the user of the battery pack 10 is informed that the manner of utilization itself is promoting the degradation of the rechargeable batteries 18, thus facilitating improved future utilization of the battery pack 10.

At step S16, as described above, a process for determining the degradation state of the rechargeable batteries 18 that uses the value of the number of chargings relative to the internal resistance is performed. However, the charging/discharging capacity may be utilized in place of the internal resistance. In that case, a reference degradation map 180 relating to charging/discharging capacity (shown in FIG. 11) should be utilized in place of the reference degradation map 120 relating to the internal resistance that is shown in FIG. 7.

Figure 11:
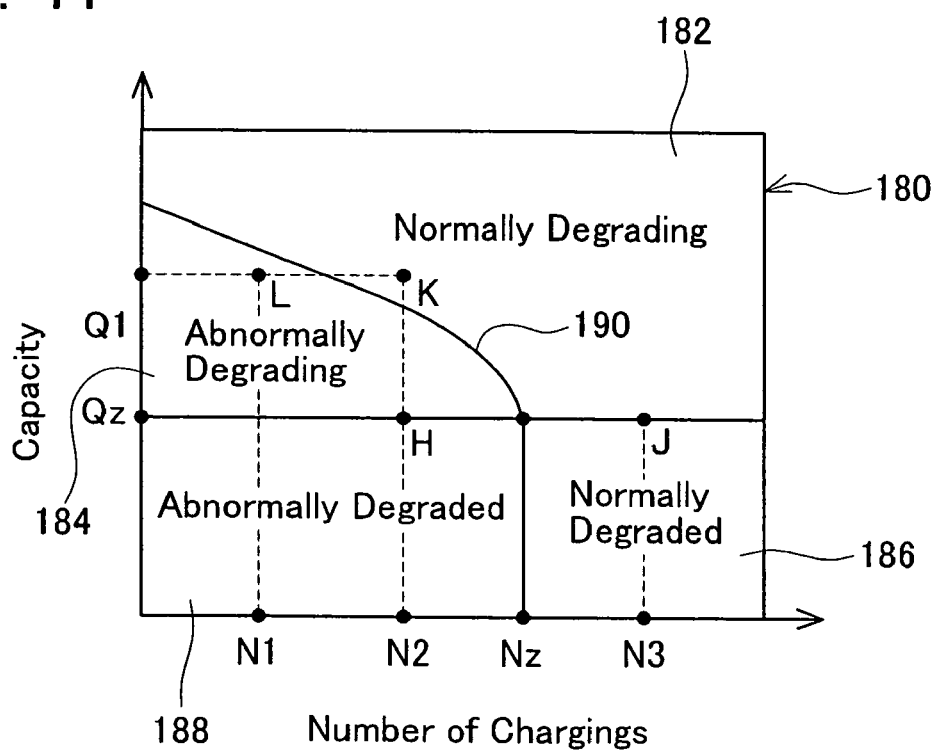
FIG. 11 shows an example of a reference degradation map relating to charging/discharging capacity.

As shown in FIG. 11, the reference degradation map 180 relating to charging/discharging capacity is a two-dimensional map wherein the number of chargings is indicated on the horizontal axis and the charging/discharging capacity is indicated on the vertical axis. The reference degradation map 180 relating to the charging/discharging capacity has a normally degrading region 182, an abnormally degrading region 184, a normally degraded region 186, and an abnormally degraded region 188, these regions being determined on the basis of the relationship between the number of chargings and charging/discharging capacity. A curved line 190 separating the normally degrading region 182 and the abnormally degrading region 184 shows the standard relationship between the number of chargings and the charging/discharging capacity of degrading rechargeable batteries 18 in the case where the manufacture and use of the battery pack 10 is normal. A charging/discharging capacity value Qz shown in the figure is a degradation reference capacity value Qz. Furthermore, a number of chargings Nz is a reference number of chargings Nz. When the rechargeable batteries 18 have been utilized normally, the charging/discharging capacity thereof is predetermined not to be less than the degradation reference capacity value Qz at this reference number of chargings Nz.

In the reference degradation map 180 relating to charging/discharging capacity, the normally degrading region 182 is a region wherein charging/discharging capacity relative to the number of chargings is equal to or above a standard value, this shows that the rechargeable batteries 18 are degrading normally relative to the number of chargings. The abnormally degrading region 184 is a region wherein charging/discharging capacity relative to the number of chargings is below the standard value, this shows that the rechargeable batteries 18 are degrading abnormally. The normally degraded region 186 is a region wherein the number of chargings is equal to or above the reference number of chargings Nz and the charging/discharging capacity is equal to or below the degradation reference capacity value Qz, this shows that the rechargeable batteries 18 have degraded normally to a stage at which they cannot be utilized. The abnormally degraded region 188 is a region wherein the number of chargings is less than the reference number of chargings Nz and charging/discharging capacity is equal to or below the degradation reference charging/discharging capacity value Qz, this shows that the rechargeable batteries 18 have degraded abnormally to a stage at which they cannot be utilized.

The reference degradation map 180 may be added to and stored in the reference data 82 (FIG. 6).

The diagnosis processing portion 90 plots, on the reference degradation map 180 relating to charging/discharging capacity that is shown in FIG. 11, the value of a pair comprising the number of chargings of the rechargeable batteries 18 that was revised at step S14 of FIG. 9 and the charging and discharging of the rechargeable batteries 18 that was detected at step S6, thereby allowing the state of degradation of the rechargeable batteries 18 to be determined. As shown in FIG. 11, when, for example, a point such as K is plotted in the normally degrading region 182, it is determined that the rechargeable batteries 18 are in a state in which they can be utilized, and it is determined that degradation is proceeding normally. When a point, such as L, is plotted in the abnormally degrading region 184, it is determined that the rechargeable batteries 18 are still in a state in which they can be utilized, and it is determined that degradation is proceeding abnormally. When a point, such as J, is plotted in the normally degraded region 186, it is determined that the rechargeable batteries 18 have degraded to a stage at which they cannot be utilized and that this degradation was normal. When a point, such as H, is plotted in the abnormally degraded region 188, it is determined that the rechargeable batteries 18 have degraded to a stage at which they cannot be utilized and that this degradation was abnormal.

It is possible to connect the battery checking system 2 to the internet by means of the internet connecting portion 96, such that information is exchanged with external computer devices, etc. via the internet. For example, the battery checking system 2 is capable of receiving new reference data 82 or the like from an external computer device.

The battery checking system 2 is capable of sending the accumulated diagnostic information data 86 stored in the storage portion 80 to an external computer device. By this means, the user of the battery checking system 2 can ask for advice from, and send diagnostic information from the battery pack 10 to, those with detailed information concerning the battery pack 10 (for example, the suppliers of the battery pack 10).

Embodiment 2

Figure 17:
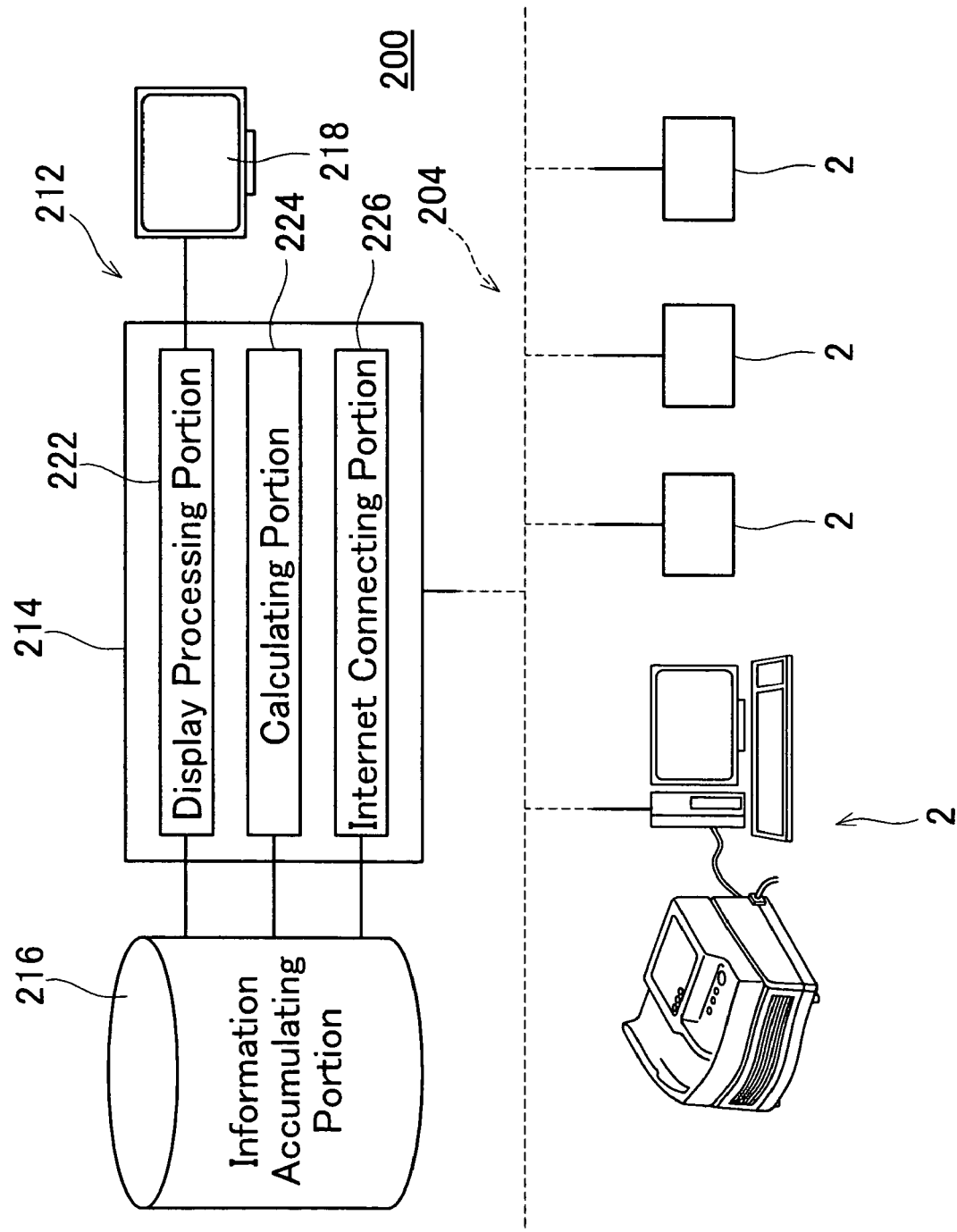
FIG. 17 shows the configuration of a battery checking network.

A battery checking network 200 embodying the present invention is described below with reference to figures. FIG. 17 shows the configuration of the battery checking network 200 of the present embodiment. As shown in FIG. 17, the battery checking network 200 comprises a host computer 212 and a plurality of battery checking systems 2 of Embodiment 1. The host computer 212 and the battery checking systems 2 are connected via the internet 204.

The host computer 212 is provided with a processing portion 214 for performing process operations of the host computer 212, a diagnostic information accumulating portion 216 for accumulating and storing diagnostic information of the battery pack 10, a display 218 for displaying the information input from the processing portion 214, etc.

The processing portion 214 has a display processing portion 222 for creating and outputting the information displayed on display 218, a determination reference calculating portion 224 for calculating determination references of the rechargeable batteries 18 from the diagnostic information stored in the diagnostic information accumulating portion 216, and an internet connecting portion 226 that connects the host computer 212 with the internet and allows the exchange of electronic information with the battery checking systems 2, etc.

The battery checking systems 2 that form a plurality of diagnosing devices at each terminal of the battery checking network 200 are the battery checking systems 2 described in Embodiment 1 and operate as described in Embodiment 1 to diagnose the battery pack 10. Here, the plurality of battery checking systems 2 of the present embodiment are connected with the internet 204 by means of the internet connecting portion 96, and are set so as to be connected when the host computer 212 searches in the internet 204.

The battery checking systems 2 send the diagnostic information obtained by performing diagnosis of the battery pack 10 to the host computer 212 via the internet 204. The battery checking systems 2 may send the diagnostic information each time diagnosis of the battery pack 10 is performed, or may store diagnostic information in the accumulated diagnostic information data 86 and send it in bulk.

The host computer 212 stores the diagnostic information sent from the battery checking systems 2 in the diagnostic information accumulating portion 216. The diagnostic information accumulating portion 216 accumulates and stores numerous items of diagnostic information sent from numerous battery checking systems 2. Diagnostic information relating to the battery packs 10 in a variety of operating environments is accumulated in the diagnostic information accumulating portion 216.

The mode of degradation of the rechargeable batteries 18 can be investigated by examining the diagnostic information stored in the diagnostic information accumulating portion 216, and further information is accumulated for the purpose of diagnosis. The diagnostic information that has been accumulated can be displayed on the display 218 by means of the display processing portion 222, and can be evaluated.

The determination reference calculating portion 224 is capable of calculating determination references of the rechargeable batteries 18 from the diagnostic information accumulated and stored in the diagnostic information accumulating portion 216. For example, the determination reference calculating portion 224 extracts a plurality of pairs of values of the charging numbers and the internal resistance from the plurality of items of stored diagnostic information, and plots these on a two-dimensional map of the number of chargings relative to the internal resistance. It is possible, from the distribution of the plotted points, to map out the normally degrading region 122, the abnormally degrading region 124, the normally degraded region 126, the abnormally degraded region 128, etc. of the reference degradation map 120 relating to the internal resistance, as shown in FIG. 7, and thereby to form a new internal resistance reference degradation map 120. Similarly, the reference activity map 140 and the reference degradation map 180 relating to charging/discharging capacity can be formed anew. The reference data created in this manner reflects a plurality of cases wherein the rechargeable batteries 18 are in a variety of operating environments, and it is possible to determine the degradation of the rechargeable batteries 18 more precisely using this reference data.

The reference data of the reference degradation map 120 relating to the internal resistance, the reference activity map 140, the reference degradation map 180 relating to the charging/discharging capacity, etc., all these being determined by the determination reference calculating portion 224, are sent to the battery checking systems 2 via the internet 204. The battery checking systems 2 update the reference data 82 stored in the storage portion 80 with the new reference data as it is sent.

One manner of using the battery pack 10 is to provide a plurality of battery packs 10 for consecutively driving a power tool, one battery pack 10 being replaced by a different charged battery pack 10 when its charged power is exhausted, and operation then being continued. Charging of the exhausted battery pack 10 begins immediately in order to prepare it for its next use. This manner of use is frequently adopted in, for example, factory assembly lines, etc. When using battery pack 10 in this manner it is necessary to calculate the workload parameters, the number of power tools, the duration of operation of one battery pack 10, the period of charging required for one battery pack 10, etc. in order to determine the number of battery packs 10 which need to be provided. If the number of battery packs 10 provided is insufficient, a problem readily occurs in which the battery packs 10 are used for an excessively long period and the rechargeable batteries 18 thereof are over discharged, this results in the power tools having an unstable output. In a situation where the number of battery packs 10 provided is too large, a problem that readily occurs is that each of the battery packs 10 is used for a short period, and charging is begun before the rechargeable batteries 18 have sufficiently discharged, this increases the probability of rechargeable batteries 18 becoming non-active. It is difficult to determine the number of battery packs 10 required correctly, and it is also difficult to assess if the number of battery packs 10 provided was correct. Unless the number of battery packs 10 required is determined correctly, the user of the battery packs 10 cannot utilize the battery packs 10 effectively. As a result, the user of the battery packs 10 may assume that the capacity of the battery packs 10 is excessively small, thus damaging the level of trust between the user of the battery packs 10 and the supplier, and hindering the healthy development of the battery industry.

The battery checking network 200 is also useful when dealing with the above problem. In order to resolve this problem, those with detailed information concerning the battery pack 10 (the suppliers or the like) can construct a battery checking network 200, which would comprise a host computer 212 that allows access, and the battery checking systems 2 that are provided at the site where the battery packs 10 are utilized.

Consider a hypothetical example: imagine a situation where a user utilizes a plurality of battery packs 10 under the same conditions of use, the user feels that the speed of degradation of the battery packs 10 is too fast and performs diagnosis of the battery packs 10 by means of the battery checking systems 2. This diagnosis shows that all the battery packs 10 have degraded abnormally. In this situation where a plurality of battery packs were utilized under the same conditions and underwent the same diagnosis, it would be suspected that the abnormal degradation is caused not by an abnormality in the battery packs 10, but instead by the manner of use. However, given the user's knowledge of the battery packs 10, it is difficult to discover the problem concerning the manner of use and to improve the manner of use.

In the battery checking network 200, the diagnostic information concerning the battery packs 10 that have been diagnosed by the battery checking systems 2 is sent to the host computer 212. At this juncture, as shown in FIG. 12, the following information with reference to the battery packs 10 can be input: the user (161 in the figure), the model of power tool, etc. (162 in the figure), the production lot number (163), the date of purchase (164), etc. Furthermore, in the comment input columns 165 and 166 it is possible to input the relationship between the number of the power tools and the number of the battery packs 10, and details regarding the operations, operating periods, etc. The diagnostic information can be transmitted in real time by means of the internet, such that there is no need to send the battery pack 10 itself.

The suppliers or the like of the battery pack 10 are capable of estimating the manner of use of the battery packs 10 based on the diagnostic information that has been sent. For example, if it is ascertained from the history of remaining quantity data of the battery packs 10 that the battery packs 10 are frequently over discharged, it is possible to estimate that these are being utilized in a state where an insufficient number of battery packs 10 have been provided. Alternatively, in the case where it can be seen that the battery packs 10 generally tend towards a non-active state, it is possible to estimate that they are being utilized in a state where too great a number of battery packs 10 have been provided. These estimations can be substantiated by means of other diagnostic information that was sent, including, for example, correlations between the model of battery pack 10 and the model of power tool, operation details, operating periods, etc. The suppliers, or the like, of the battery packs 10 can suggest to the user methods for improving the manner of use of the battery packs 10, such as increasing or decreasing the number of battery packs 10, alterations to the power tool, etc. In this manner, it is possible for the user of the battery packs 10 to receive diagnosis from the suppliers, or the like, of the battery packs 10 by means of the battery checking network 200, with this diagnosis concerning the manner of use of the battery packs 10. Furthermore, it is possible for the suppliers, or the like, of the battery packs 10 to provide feedback to the users following any improvements in the manner of use of the battery packs 10. After the users of the battery packs 10 have improved the manner of use of the battery packs 10 based on the diagnosis from the suppliers or the like of the battery packs 10, the users may again perform diagnosis of the battery packs 10 by means of the battery checking systems 2, and may send this diagnostic information to the suppliers of the battery packs 10. The suppliers of the battery packs 10 can thus confirm the effectiveness of the suggested changes to the manner of use by means of the diagnostic information they receive. By this means, it is possible to build up a relationship of trust between the users and the suppliers of the battery packs 10, and promote the healthy development of the battery industry.

The battery checking network 200 described above is also useful in the example described below.

The charging process of the battery packs 10 is performed based on the charging characteristics data stored in the EEPROM 21. The charging characteristics data determines the charging current and the required frequency of the refresh operation on the basis of the characteristics, etc. of the rechargeable batteries 18, such that the capacities of the rechargeable batteries 18 are maintained during a plurality of charging and discharging cycles.

The manner of use of the battery packs 10 is not necessarily the same for each individual battery pack 10, and the charging characteristics data stored in the EEPROM 21 is not necessarily optimal depend upon the user requirements for the rechargeable batteries 18 of each battery pack 10. For example, a battery pack 10 utilized in a charging and discharging cycle, wherein the battery pack 10 is charged to a fully charged state after adequate discharging, will not readily enter a non-active state, and consequently will scarcely need a refresh operation. It is possible to reduce the degradation of the rechargeable batteries 18 in this type of battery pack 10 by reducing the frequency of the refresh operation. Since refresh operations are time-consuming, many users also wish to reduce their frequency. Other users wish charging to be completed within a short period even though this will somewhat hasten the degradation of the rechargeable batteries 18. In this manner, individual characteristics concerning the charging process of the battery pack 10 frequently differ not only in accordance with the characteristics of the rechargeable batteries 18, but also in the manner of use. Conventionally, charging characteristics data that provides the greatest common factor to a variety of manners of usage was applied uniformly to all battery packs 10.

In the case where the user of the battery packs 10 wishes to revise the provisions concerning the charging process of the battery packs 10, the battery packs 10 are diagnosed by the battery checking systems 2. At this juncture, as shown in FIG. 12, the following information with reference to the battery packs 10 is input: the owner (161 in the figure), the model of power tool, etc. (162 in the figure), the production lot number (163), the date of purchase (164), etc. Further, in the comment input columns 165 and 166 it is possible to input the manner of use of the battery packs 10, the desired characteristics of the battery packs 10, etc. For example, it is possible to input 'I want to reduce the frequency of the refresh operation', or the like. This diagnostic information regarding the battery packs 10 is sent to the host computer 212. Since this is sent via the internet, the diagnostic information can be transmitted in real time even to a remote host computer 212, such that there is no need to send the battery packs 10 themselves.

The suppliers, or the like, of the battery packs 10 can ascertain the charging characteristics data of the battery packs 10 from the diagnostic information of the battery packs 10 sent to the host computer 212. Further, the suppliers or the like can ascertain the state of degradation, the manner of use, etc. of the battery packs 10. Furthermore, it is possible for the suppliers or the like to ascertain the characteristics of the battery packs 10 desired by the users.

The suppliers, or the like, of a number of battery packs 10 determine whether the charging characteristics data of the battery packs 10 are suitable by diagnosing the actual state of degradation of the battery packs 10 together with the manner of use. For example, in the case where over discharge frequently occurs without any indication of non-active status on the part of the rechargeable batteries 18, it can be diagnosed that the frequency of the refresh operation should be reduced. If the user wishes to reduce the frequency of the refresh operation, it is possible to ascertain whether this measure is appropriate for the battery packs 10. The suppliers, or the like, of the battery packs 10 send charging characteristics data for reducing the frequency of the refresh operation from the host computer 212 to the battery checking systems 2. The new charging characteristics data that the battery checking systems 2 have received is sent to the control portion 61 of the checking adaptor 50, and the control portion 61 replaces the charging characteristics data stored in the EEPROM 21 of the battery pack 10 with the new charging characteristics data. The battery pack 10 that has been updated with the revised charging characteristics data reduces the frequency at which the refresh operation is demanded.

Embodiment 3

Figure 18:
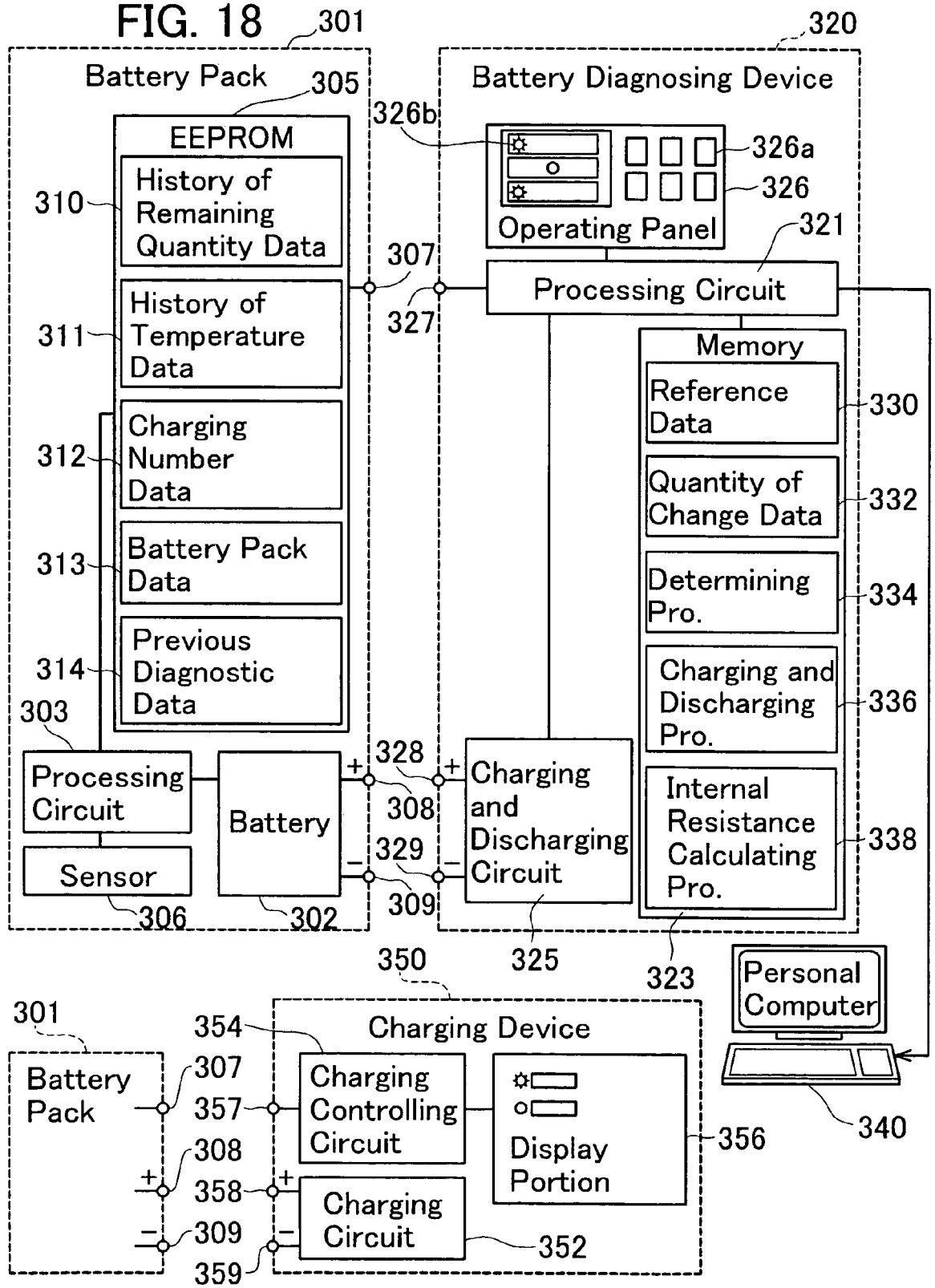
FIG. 18 shows the configuration of a battery diagnostic device of third embodiment.

A different battery diagnosing device embodying the present invention is described below with reference to figure FIG. 18 shows a battery diagnosing device 320 of the present embodiment for performing diagnosis of the battery pack 301, and a personal computer 340 connected with the battery diagnosing device 320.

The battery pack 301 is equipped with a rechargeable battery 302 capable of being charged repeatedly. The battery pack 301 is provided with a processing circuit 303, an EEPROM 305, and a temperature sensor 306. Further, the battery pack 301 is provided with a memory terminal 307 to be electrically connected with the exterior, a positive terminal 308, and a minus terminal 309. The memory terminal 307 is electrically connected with the EEPROM 305. The positive terminal 308 is electrically connected with a positive pole of the battery 302. The minus terminal 309 is electrically connected with the negative pole of the battery 302.

The EEPROM 305 stores the history of remaining quantity data 310, the history of temperature data 311, the charging number data 312, the battery pack data 313, and the previous diagnostic data 314. These data are the same as those of the battery checking system 2.

The battery diagnosing device 320 is provided with a processing circuit 321 for performing processes relating to diagnosis, a memory 323 for storing data and programs utilized in the processing of the processing circuit 321, a charging and discharging circuit 325 for charging and discharging the battery 302 from the battery pack 301 being diagnosed, and an operating panel 326 by means of which the user operates the battery diagnosing device 320 and on which information is displayed to the user.

The memory 323 stores reference data 330. The reference data 330 is reference data for determining the state of degradation of the battery 302. The reference data 330 stores the reference degradation map 120 relating to the internal resistance shown in FIG. 7, the reference activity map 140 shown in FIG. 8, the reference degradation map 180 relating to charging/discharging capacity shown in FIG. 11, etc.

The memory 323 stores quantity of change data 332. The quantity of change data 332 is data that can be utilized when calculating how many further charging and discharging cycles can be performed on the battery 302 after diagnosis until completion of degradation occurs (hereafter, the number of charging and discharging cycles is referred to as the number of remaining chargings). The quantity of change data 332 is composed of quantity of decline of capacity data: this comprises storing the quantity of decline of the charging/discharging capacity relative to the number of chargings of the battery 302, the quantity of increase of the internal resistance data: this comprises storing the quantity of increase of internal resistance relative to the number of chargings of the battery 302, etc. In the quantity of decline of capacity data, the smaller the unit quantity that is used for storing the number of chargings, the more precisely the number of remaining chargings can be measured. However, a greater quantity of data can be stored if the unit quantity used for storing the performed number of chargings in the quantity of decline of capacity data is smaller. To deal with this, the unit quantity used for storing the number of chargings in the quantity of decline of capacity data could be set so as to correspond to the method to be implemented. The same applies to the quantity of increase of internal resistance data.

The memory 323 stores a determining program 334. The determining program 334 is a program for determining the state of degradation of the battery 302, and is implemented by the processing circuit 321.

The memory 323 stores a charging and discharging program 336. The charging and discharging program 336 is a program that is implemented by the processing circuit 321 when the battery 302 (this having been connected) is to be charged or discharged.

The memory 323 stores an internal resistance calculating program 338. The internal resistance calculating program 338 is a program that is implemented by the processing circuit 321 when the internal resistance of the battery 302 is to be measured.

The charging and discharging circuit 325 is controlled by the processing circuit 321 and performs charging and discharging of the battery 302. At this juncture, the processing circuit 321 utilizes the charging and discharging program 336 stored in the memory 323. The battery diagnosing device 320 is capable of charging and discharging the battery 302 by means of the charging and discharging circuit 325, and is capable of measuring the internal resistance of the battery 302. Based on the current values and voltage values detected by the charging and discharging circuit during charging and discharging, the battery diagnosing device 320 utilizes the internal resistance calculating program 338 to calculate the internal resistance. Furthermore, the charging and discharging circuit 325 is capable of measuring the charging/discharging capacity of the battery 302 after the battery 302 has been connected, fully charged, and then fully discharged.

Figure 19:
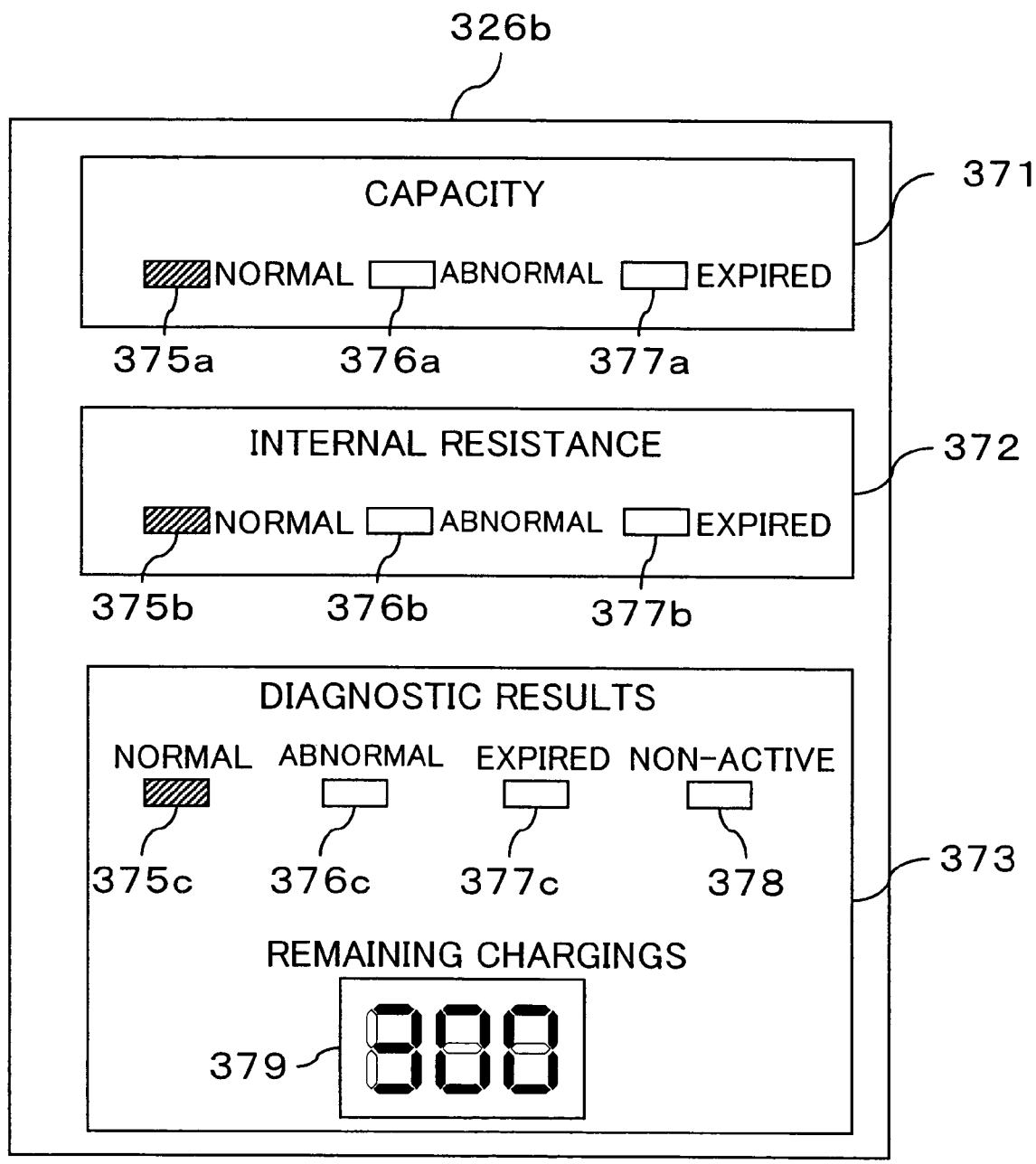
FIG. 19 shows a display of the battery diagnostic device of the third embodiment.

The operating panel 326 is provided with a switch 326a, etc. for operating the battery diagnosing device 320, and a result display portion 326b on which diagnostic results are displayed. The result display portion 326b is shown in FIG. 19. The result display portion 326b is provided with a first display portion 371, a second display portion 372, and a third display portion 373. The first display portion 371 displays the results of a first diagnosis that utilizes the charging/discharging capacity and the number of chargings. The second display portion 372 displays the results of a second diagnosis that utilizes the internal resistance and the number of chargings. The third display portion 373 displays the combined results wherein the results of the first diagnosis and the results of the second diagnosis are combined. Moreover, the third display portion 373 displays the estimated number of remaining chargings.

The first display portion 371 is provided with an LED 375a, an LED 376a, and an LED 377a, these being illuminated to display diagnostic results. The second display portion 372 is provided with an LED 375b, an LED 376b, and an LED 377b that display diagnostic results. The third display portion 373 is provided with an LED 375c, an LED 376c, an LED 377c, and an LED 378 that display diagnostic results. Furthermore, the third display portion 373 is also provided with an array consisting of three columns of seven segment LEDs 379, which display to the user the estimated number of remaining chargings.

The battery diagnosing device 320 is equipped with a data terminal 327, a plus output terminal 328, and a minus output terminal 329. The connecting terminals 327 to 329 are connecting terminals for establishing an electrical connection with the battery pack 301. The data terminal 327 is electrically connected with the processing circuit 321. The plus output terminal 328 is electrically connected with a positive pole output of the charging and discharging circuit 325. The minus output terminal 329 is electrically connected with a negative pole output of the charging and discharging circuit 325. When the battery pack 301 is connected with the battery diagnosing device 320, the memory terminal 307 of the battery pack 301 and the data terminal 327 of the battery diagnosing device 320 are electrically connected, the plus terminal 308 of the battery pack 301 and the plus output terminal 328 of the battery diagnosing device 320 are electrically connected, and the minus terminal 309 of the battery pack 301 and the minus output terminal 329 of the battery diagnosing device 320 are electrically connected.

Furthermore, the processing circuit 321 of the battery diagnosing device 320 can be connected with the personal computer 340.

A charging device 350 charges the battery 302 of the battery pack 301. The charging device 350 is provided with a charging circuit 352 for supplying power to the battery 302 of the battery pack 301, a charging controlling circuit 354 for controlling the charging circuit 352, and a display portion 356 for displaying the operating state of the charging device 350. Further, the charging device 350 is provided with a data terminal 357, a plus output terminal 358, and a minus output terminal 359, these being connecting terminals for establishing an electrical connection with the battery pack 301. The data terminal 357 and the charging controlling circuit 354 are electrically connected. The plus output terminal 358 is electrically connected with a positive pole output of the charging circuit 352. The minus output terminal 359 is electrically connected with a negative pole output of the charging circuit 352.

When the battery pack 301 is connected with the charging device 350, the charging device 350 and the battery pack 301 are electrically connected and the battery 302 is charged. At this juncture, the charging controlling circuit 354 updates the charging number data 312 stored in the EEPROM 305 of the battery pack 301.

During charging, the processing circuit 303 within the battery pack 301 sums the charging current of the battery 302, calculates, over time, the remaining quantity of the battery 302, and sends this data to the history of remaining quantity data 310 of the EEPROM 305. Moreover, the temperature of the battery 302 is calculated over time by the temperature sensor 306, and this is stored in the history of temperature data 311 of the EEPROM 305.

Figure 20:
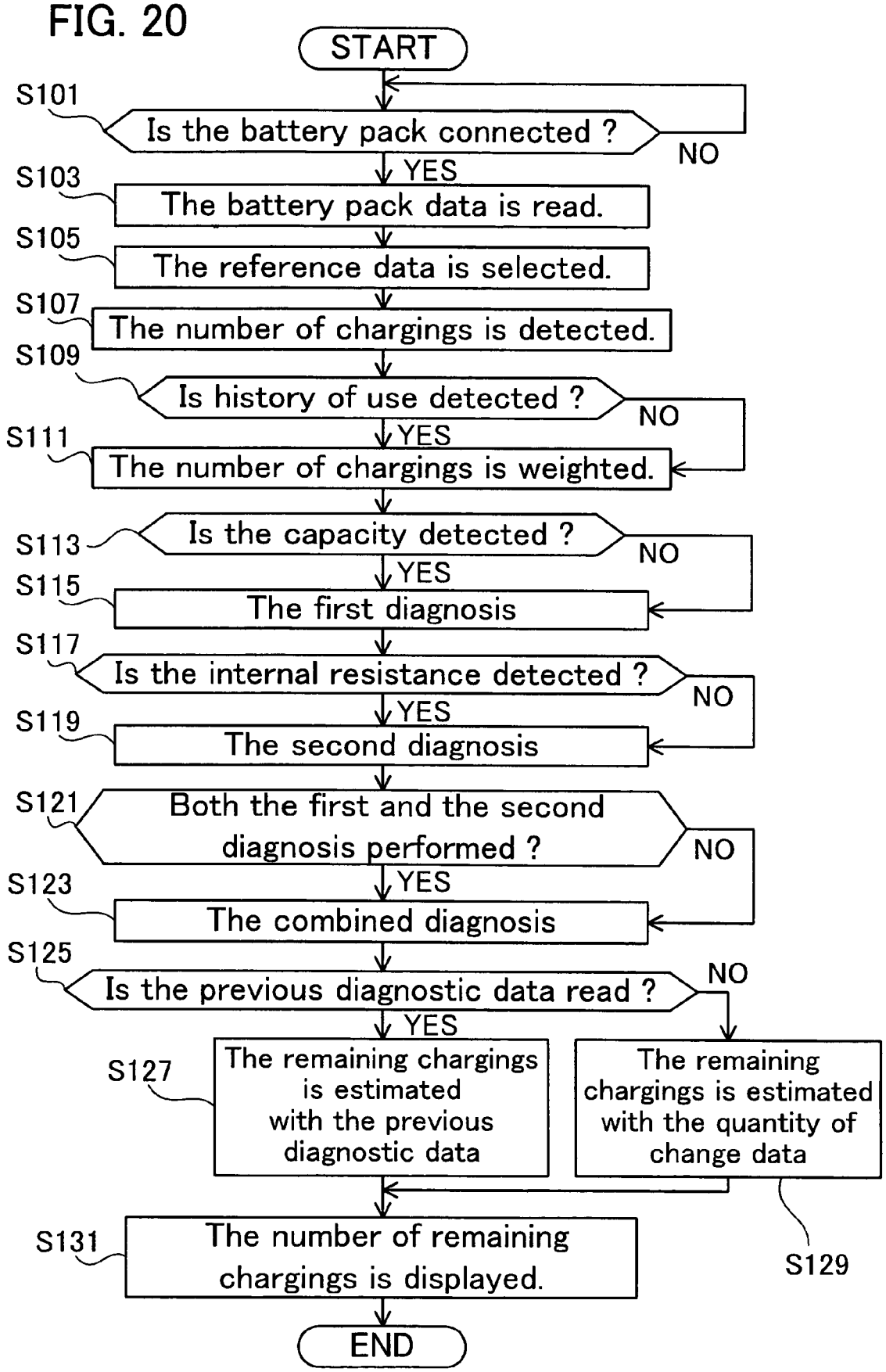
FIG. 20 is a flowchart showing the sequence of operation of the battery diagnostic device of the third embodiment.

FIG. 20 is a flowchart showing the sequence of operation of the battery diagnosing device 320. The sequence of operation of the battery diagnosing device 320 will be described below, with reference to the flowchart of FIG. 20. The sequence illustrated by the flowchart in FIG. 20 is commenced by attaching the battery diagnosing device 320 to a power source, etc. The processing circuit 321 of the battery diagnosing device 320 begins to implement the determining program 334.

At step S101, the battery diagnosing device 320 is in a waiting state prior to having the battery pack 301 connected therewith.

At step S103, the specification and characteristics of the battery pack 301 are detected. The processing circuit 321 of the battery diagnosing device 320 reads the battery pack data 313 of the battery pack 301. In the case where the battery pack data 313 of the battery pack 301 cannot be read, the user, or the like, may input information by means of the operating panel 326.

At step S105, the reference data for determining degradation is selected. On the basis of the battery pack data 313 of the battery pack 301 detected at step S103, the most suitable determination references for diagnosing the battery 302 are selected from the reference data 330 stored in the memory 323. In the case where the specification and the characteristics of the battery pack 301 were not detected, predetermined universal determination references may be utilized. However, it is preferable that the determination references are selected on the basis of the specification and the characteristics of the battery pack 301. Here, the selected determination references, corresponding to the battery pack 301, are the reference degradation map 120 relating to internal resistance shown in FIG. 7, the reference activity map 140 shown in FIG. 8, and the reference degradation map 180 relating to charging/discharging capacity shown in FIG. 11.

At step S107 of FIG. 20, the number of chargings of the battery 302 is detected. The processing circuit 321 reads the charging number data 312 stored in the EEPROM 305 of the battery pack 301.

At step S109, the history of use of the battery 302 is detected. The processing circuit 321 reads the history of remaining quantity data 310 and the history of temperature data 311 stored in the EEPROM 305 of the battery pack 301. The history of occurrences which can cause degradation, such as over discharging, over charging etc. of the battery 302 is extracted from the history of remaining quantity data 310 that was read during this step. Moreover, further history of occurrences which can cause of degradation, such as deviations from the prescribed temperature range, is extracted from the history of temperature data 311 that was read during this step. From the remaining quantity and history of temperature data that was extracted it is determined whether the history of use of the battery 302 is 'normal' or 'rigorous'. For example, in a case where the number of over dischargings and number of over chargings exceeds a predetermined number, the history of use of the battery 302 may be determined to be 'rigorous'. Alternatively, when the rate of use outside the prescribed temperature range is equal to or above a predetermined limit, the history of use of the battery 302 may be determined to be 'rigorous'. When the history of use of the battery 302 is not detected at step S109, the process proceeds to step S113.

At step S111, the detected number of chargings is weighted using the history of use of the battery 302 detected at step S109. In the case where the history of use was determined to be 'rigorous' in step S109, the detected number of chargings is weighted. An example of the weighting process is to revise the detected number of chargings to 1.5 times the original number. In the battery diagnosing device 320 of the present embodiment, when the history of use is 'rigorous', the number of chargings detected in step S107 is revised so as to be weighted by 1.5 times the original number. Further, in the case where the history of use is 'normal', the number of chargings is not revised. In the description below, an example is given wherein the history of use is 'normal'. Furthermore, in the case where the detection of the history of use of the battery 302 is not performed at step S109, weighting is not given to the number of chargings at step S111, but diagnosis is performed in the manner described below.

At step S113, the charging/discharging capacity of the battery 302 is detected. The processing circuit 321 reads the history of remaining quantity data 310 stored in the EEPROM 305 of the battery pack 301. The charging/discharging capacity of the battery 302 is the most recent maximal value of the history of remaining quantity data 310. In a case where it is not possible to read the history of remaining quantity data 310, the battery 302 may be fully discharged after having been fully charged, and the discharged quantity is measured by means of the battery diagnosing device 320. The charging/discharging capacity of the battery 302 that has been detected is related to the number of chargings detected at step S107, and is stored in the previous diagnostic data 314 of the EEPROM 305 of the battery pack 301. When the charging/discharging capacity of the battery 302 has been detected, the process proceeds to step S115. When the charging/discharging capacity of the battery 302 has not been detected, the process proceeds to step S117.

At step S115, the first diagnosis is performed. This diagnosis utilizes the number of chargings of the battery 302 detected at step S107 or the revised number of chargings determined at step S111, and the detected charging/discharging capacity of the battery 302. During the first diagnosis, the reference degradation map 180 relating to charging/discharging capacity shown in FIG. 11 is utilized. It is determined, by means of the first diagnosis, whether the state of degradation of the battery 302 of the battery pack 301 is 'abnormally degraded', 'normally degraded', 'abnormally degrading', or 'normally degrading'.

The results of the first diagnosis are displayed on the result display portion 326b of the operating panel 326. Specifically, the diagnostic results are displayed by means of illuminating certain LEDs of the LEDs 375a, 376a, or 377a of the capacity diagnosis display portion 371. If the state of degradation of the battery 302 was diagnosed to be 'normally degrading', only the LED 375a is illuminated. If the state of degradation of the battery 302 was diagnosed to be 'abnormally degrading', only the LED 376a is illuminated. If the state of degradation of the battery 302 was diagnosed to be 'normally degraded', only the LED 377a is illuminated. If the state of degradation of the battery 302 was diagnosed to be 'abnormally degraded', both the LED 376a and the LED 377a are illuminated. The user of the battery diagnosing device 320 is thereby able to know the results of the first diagnosis.

At step S117, the internal resistance of the battery 302 is detected. The battery diagnosing device 320 measures the internal resistance of the battery 302. The internal resistance of the battery 302 that has been detected is related to the number of chargings detected at step S107, and is stored in the previous diagnostic data 314 of the EEPROM 305 of the battery pack 301. At step S117, when the internal resistance of the battery 302 has been detected, the process advances to step S119. When the internal resistance of the battery 302 has not been detected, the process proceeds to step S121.

At step S119, the second diagnosis is performed. The second diagnosis utilizes the number of chargings of the battery 302 detected at step S107 or the revised number of chargings determined at step S111, and the detected internal resistance of the battery 302. In the second diagnosis, the reference degradation map 120 relating to internal resistance shown in FIG. 7 is utilized. It is determined, by means of the second diagnosis, whether the state of degradation of the battery 302 of the battery pack 301 is 'abnormally degraded', 'normally degraded', 'abnormally degrading', or 'normally degrading'.

The results of the second diagnosis are displayed on the result display portion 326b of the operating panel 326. Specifically, the diagnostic results are displayed by means of illuminating certain LEDs of the LEDs 375b, 376b, or 377b of the internal resistance diagnosis display portion 372. If the state of degradation of the battery 302 was diagnosed to be 'normally degrading', only the LED 375b is illuminated. If the state of degradation of the battery 302 was diagnosed to be 'abnormally degrading', only the LED 376b is illuminated. If the state of degradation of the battery 302 was diagnosed to be 'normally degraded', only the LED 377b is illuminated. If the state of degradation of the battery 302 was diagnosed to be 'abnormally degraded', both the LED 376b and the LED 377b are illuminated. The user of the battery diagnosing device 320 is thereby able to know the results of the second diagnosis.

The first diagnosis and the second diagnosis described above are independent and do not operate in tandem until step S119. As a result, it is possible to determine whether the degradation of the battery 302 is normal or abnormal by using only the first diagnosis, which utilizes the charging/discharging capacity and the number of chargings. Moreover, when batteries have degraded to a state wherein usage is problematic (when batteries have reached the end of their life) it is possible to know whether the batteries reached this state through normal degradation or abnormal degradation. It is also possible to obtain the same diagnostic results using only the second diagnosis, which utilizes the internal resistance and the number of chargings.

At step S121 of FIG. 20, it is confirmed whether the first diagnosis, which utilizes the charging/discharging capacity and the number of chargings, has been performed, and it is also confirmed whether the second diagnosis, which utilizes internal resistance and the number of chargings, has been performed. In the case where both the first diagnosis and the second diagnosis have been performed, the process proceeds to step S123. If it is not the case that both the first diagnosis and the second diagnosis have been performed, the process proceeds to step S125.

At step S123, a combined diagnosis of the state of the battery 302 is performed utilizing the first diagnostic results and the second diagnostic results. FIG. 21 shows a diagnostic reference of the combined diagnosis. In the combined diagnosis, for example, if the first diagnostic result is 'abnormally degraded' when the second diagnostic result is 'normally degrading', it is diagnosed that the battery 302 is normal but is in a non-active state. By using the combined diagnosis, a battery 302 that is in a non-active state is not misdiagnosed as being in a normal or an abnormal state.

The combined diagnostic reference shown in FIG. 21 combines the reference degradation map 120, which relates to the internal resistance of the reference data 330, with the reference degradation map 180, which relates to the charging/discharging capacity, thereby forming a three-dimensional map that stores the state of the battery, this comprising capacity, the internal resistance, and the number of chargings. By performing the combined diagnosis it is possible to distinguish whether a normal battery is in a normal state or a non-active state.

The results of the combined diagnosis are displayed on the result display portion 326b of the operating panel 326. Specifically, the diagnostic results are displayed by means of illuminating certain LEDs of the LEDs 375 to 378 of the combined diagnosis display portion 373. If the state of degradation of the battery 302 was diagnosed to be 'normally degrading', only the LED 375c is illuminated. If the state of degradation of the battery 302 was diagnosed to be 'abnormally degrading', only the LED 376c is illuminated. If the state of degradation of the battery 302 was diagnosed to be 'normally degraded', only the LED 377c is illuminated. If the state of degradation of the battery 302 was diagnosed to be 'abnormally degraded', both the LED 376c and the LED 377c are illuminated. If the state of the battery 302 was diagnosed to be 'non-active', only the LED 378 is illuminated. The user of the battery diagnosing device 320 is thereby able to know the results of the combined diagnosis.

At step S125, the number of chargings, the charging/discharging capacity and the internal resistance of the battery 302 that were detected during previous diagnoses of the battery pack 301 are detected. The processing circuit 321 reads the previous diagnostic data 314 stored in the EEPROM 305 of the battery pack 301. When the detected values from previous diagnoses of the battery 302 have been detected, the process proceeds to step S127. When these values have not been detected, the process proceeds to step S129. The detected values from previous diagnoses may, for example, be stored in the battery diagnosing device 320 by means of the personal computer 340 that the user has connected, etc.

At step S127, the number of remaining chargings is estimated utilizing the detected values from previous diagnoses and the detected values from the present diagnosis. The number of remaining chargings may be calculated utilizing a plurality of pairs of data consisting of the detected values of the charging/discharging capacity and the detected values of the number of chargings. Alternatively, it is possible to utilize a plurality of pairs of data consisting of the detected values of the internal resistance and the detected values of the number of chargings. One or the other of these pluralities of pairs of data will suffice.

Figure 22:
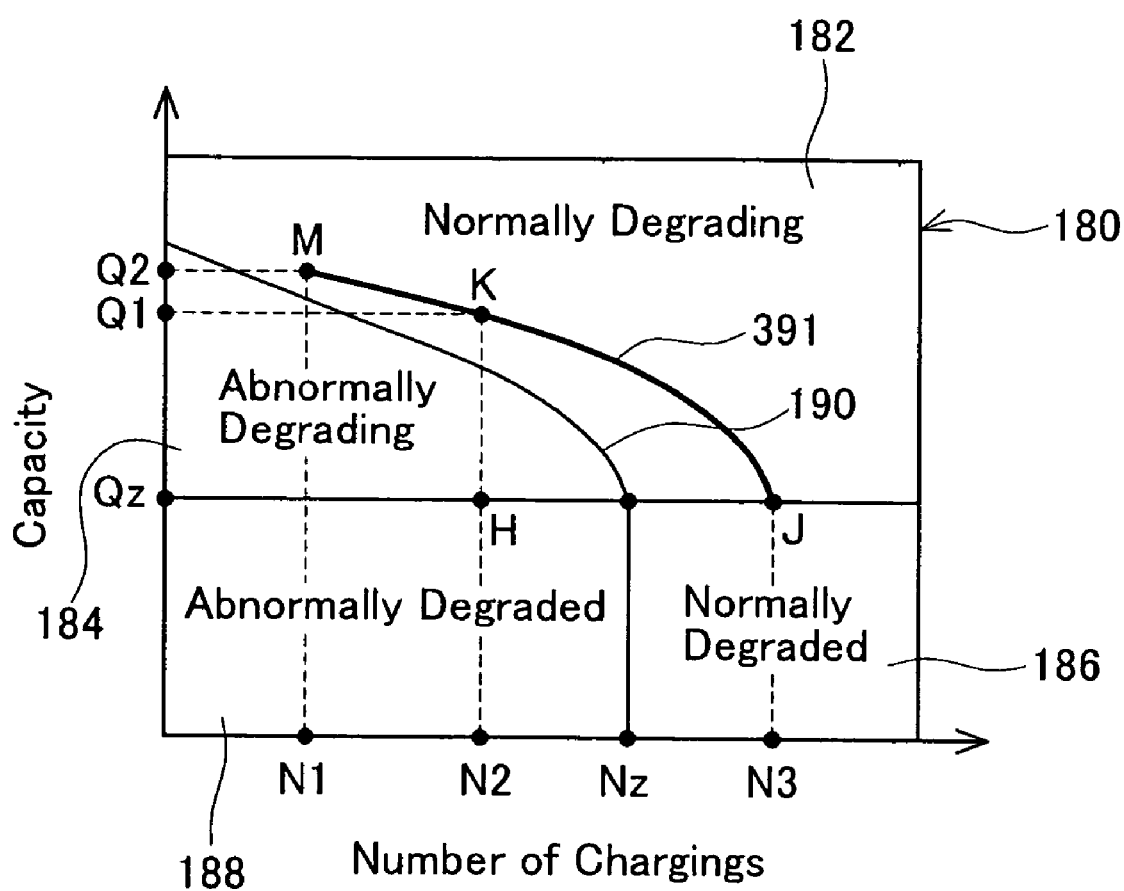
FIG. 22 shows a process whereby the battery diagnostic device of the third embodiment estimates a number of remaining charging/discharging cycles from a plurality of pairs of data.

Using FIG. 22, a method will be described for estimating the number of remaining chargings from, for example, two pairs of data, each consisting of a charging/discharging capacity and a number of chargings. The reference degradation map 180, relating to the charging/discharging capacity stored in the reference data 330, is utilized in estimating of the number of remaining chargings. In the reference degradation map 180, relating to charging/discharging capacity, shown in FIG. 22, a point M shows the detected value of charging/discharging capacity relative to the number of chargings that was detected during previous diagnoses of the battery 302. That is, the charging/discharging capacity detected in previous diagnoses is Q2, and the number of chargings detected is N1. Further, the detected value of the charging/discharging capacity relative to the number of chargings that was detected during the present diagnosis is shown by the point K. That is, the charging/discharging capacity detected in the present diagnosis is Q1, and the number of chargings detected is N2. The processing circuit 321 plots the point M and the point K on the reference degradation map 180, which relates to the charging/discharging capacity, and forms a curved line of transitions 391 that passes through the point M and the point K. A point J can be found from the curved line of transitions 391 that was formed, this point J being a point where the charging/discharging capacity is equal to the degradation reference capacity value Qz. The number of chargings shown by point J is N3. That is, N3 is the total number of chargings before the battery 302 reaches a state in which utilization is not possible. Since the number of chargings is N2 in the present diagnosis, the number of remaining chargings can be found from the difference between N3 and N2.

By utilizing a plurality of pairs of data that consist of the charging/discharging capacity and the number of chargings, it is possible to extrapolate the trend corresponding to the decrease in charging/discharging capacity relative to the increase in the number of chargings, and to estimate the number of remaining chargings. The trend corresponding to the decrease in charging/discharging capacity relative to the increase in the number of chargings differs according to the manner of use of the battery. The battery diagnosing device here is capable of accurately estimating the number of remaining chargings for various manners of use of the battery.

The curved line of transitions 391 can be formed by utilizing a locus building method commonly used in statistics, etc. When there is little detected data, it is possible to form a reliable locus by extrapolating empirical data concerning the quantity of change in capacity relative to the number of chargings, and thereby forming the curved line of transitions 391. At this juncture, the quantity of change data 332 stored in the memory 323 of the battery diagnosing device 320 may also be utilized.

Above, a case was described wherein the number of remaining chargings was estimated utilizing a plurality of pairs of data comprising the charging/discharging capacity relative to the number of chargings. However, in a case wherein estimation utilizes the internal resistance, the estimation is performed in the same manner. It is possible to estimate, in the same manner, the number of remaining chargings utilizing the internal resistance reference degradation map 120.

When the history of previous diagnoses of the battery 302 has not been detected at step S125 and the process proceeds to step S129, a different process is performed to estimate the number of remaining chargings. The estimation of the number of remaining chargings performed at step S129 is approximately the same as the process whereby the battery checking system 2 of Embodiment 1 estimates the degree of degradation progress. As shown in FIG. 10, the data point of corresponding to the internal resistance relative to the number of chargings is plotted (point X) on the internal resistance reference degradation map 120, and the quantity of change data 332 is utilized to form the curved line 132 concerning the future progression of the number of chargings and the internal resistance. The number of chargings N3 is found using the curved line of transitions 132, this number of chargings N3 being the number at which internal resistance reaches the degradation reference resistance value Rz, and the number of remaining chargings (the difference between N3 and the current number of chargings N2) is calculated.

At this juncture, the amount the internal resistance increases relative to the number of chargings, this being stored in the quantity of change data 332, may be revised in accordance with the history of use detected at step S109. As described earlier, the speed of degradation progress varies according to the manner in which the rechargeable battery is used. That is, the amount the internal resistance increases relative to the number of chargings varies according to the manner of use. By revising the amount the internal resistance increases relative to the number of chargings in accordance with the history of use, it is possible to accurately estimate the number of remaining chargings for various methods of use of the battery 302.

Above, a case was described wherein the number of remaining chargings was estimated utilizing data of capacity relative to an existing number of chargings. However, in a case wherein an estimation utilizing the internal resistance is performed, the number of remaining chargings can be estimated in the same manner.

At step S131, the number of remaining chargings of the battery 302 found at step S127 or step S129 is displayed on the display portion 326b of the operating panel 326. The number of remaining chargings is displayed as a numerical value on the array of seven segment LEDs 379 of the combined diagnosis display portion 373.

As described above, the battery diagnosing device 320 diagnoses the state of degradation of the battery 302 from the number of chargings and from at least one of the charging/discharging capacity and the internal resistance of the battery 302. By this means, it is possible to diagnose, in a battery wherein the charging/discharging capacity has fallen, whether the fall in charging/discharging capacity is part of normal degradation or is a result of failure. Further, it is possible to diagnose, in a battery wherein the internal resistance has increased, whether the increase in the internal resistance is part of normal degradation or is a result of failure. Moreover, it is possible to determine whether a battery is in a non-active state by means of a diagnosis that utilizes both the capacity and the internal resistance of the battery, as well as utilizing the relationship of the two with the existing number of chargings. Consequently, it is possible to accurately determine the number of remaining chargings of the battery.

Specific examples of embodiments of the present invention are presented above, but these merely illustrate some possible embodiments of the invention and do not restrict the claims thereof. The art set forth in the claims includes various transformations and modifications to the specific examples set forth above.

In the present embodiments, the cumulative number of chargings was chosen to be an indicator of the usage quantity of the rechargeable batteries. However, other indicators of the usage quantity can also be chosen, such as cumulative discharging time, cumulative charging time, cumulative discharged quantity of power, cumulative charged quantity of power, etc. The indicator can be chosen freely to suit the mode of implementation, and the design of the present embodiment can be changed to correspond thereto.

In the present embodiments, the internal resistance and the charging/discharging capacity were chosen to be indicators of degradation progress for the rechargeable batteries. However, the indicators are not limited thereto. Indicators that change in accordance with the progress of degradation of the rechargeable batteries can be chosen freely, and the design of the present embodiment can be changed to correspond thereto.

The methods for detecting the number of chargings, internal resistance, charging/discharging capacity, etc. chosen in the present embodiments are no more than examples, and these indicators may also be detected by means of other methods.

The internet is utilized in the battery checking network of the present embodiments. However, other computer networks may also be chosen. Electronic information communication techniques that are yet to be developed can also be chosen.

In the battery checking system of the present embodiments, an example has been chosen wherein an adaptor is attached between the charger and the battery pack 301. However, the invention is not limited to this example. The same type of battery checking system can have a configuration that does not have the charger, etc. connected therewith.

Furthermore, the technical elements disclosed in the present specification or figures may be utilized separately or in all types of conjunctions and are not limited to the conjunctions set forth in the claims at the time of submission of the application. Furthermore, the art disclosed in the present specification or figures may be utilized to simultaneously realize a plurality of aims or to realize one of these aims.

The invention claimed is:

1. A battery diagnosing device for determining whether a rechargeable battery has degraded normally or abnormally, comprising:
    a device for determining a usage quantity that indicates how much the rechargeable battery has been used,
    a device for measuring a degradation indicator that changes in accordance with progress of the degradation of the rechargeable battery, wherein the degradation indicator is measured independently from the usage quantity, and
    a device for comparing a reference usage quantity with the determined usage quantity when the measured degradation indicator has exceeded a reference degradation value, wherein the reference usage quantity indicates how much the rechargeable battery can be used normally until the degradation indicator exceeds the reference degradation value.

2. A battery diagnosing device as set forth in claim 1, wherein,
    the degradation indicator is one of:
        the internal resistance, and
        the charging/discharging capacity, and
    the usage quantity is one of:
        cumulative discharging time,
        cumulative charging time,
        cumulative discharged quantity of power,
        cumulative charged quantity of power, and
        cumulative number of charging cycles.

3. A battery diagnosing device as set forth in claim 2, wherein,
    the usage quantity is modified based upon a frequency of occurrence of over discharging and/or over-rapid charging.

4. A diagnostic information collecting system, comprising:
    a plurality of diagnosing devices, each of the plurality of diagnosing devices comprising:
        a device for determining a usage quantity that indicates how much the rechargeable battery has been used,
        a device for measuring a degradation indicator that changes in accordance with progress of the degradation of the rechargeable battery, wherein the degradation indicator is measured independently from the usage quantity, and
        a device for comparing a reference usage quantity with the determined usage quantity when the measured degradation indicator has exceeded a reference degradation value, wherein the reference usage quantity indicates how much the rechargeable battery can be used normally until the degradation indicator exceeds the reference degradation value;
    an information accumulating device for accumulating and storing diagnostic information that the plurality of diagnosing devices obtains through diagnoses of rechargeable batteries, and
    a communication means for connecting the plurality of diagnosing devices and the information accumulating device via a computer network,
    wherein the communication means transmits the diagnostic information obtained by the diagnosing devices to the information accumulating device.

5. A diagnostic information collecting system as set forth in claim 4, further comprising a reference value calculating means that extracts the relationship between the usage quantity and the degradation indicator from the diagnostic information accumulated by and stored in the information accumulating device, and calculates at least one reference value concerning to the degradation indicator or the usage quantity,
    wherein the communication means transmits the reference value calculated by the reference value calculating means to at least one of the diagnosing devices.

6. A battery diagnosing device for determining whether a rechargeable battery is degrading normally or abnormally, comprising:
    a device for determining a usage quantity that indicates how much the rechargeable battery has been used,
    a device for measuring a degradation indicator that changes in accordance with progress of the degradation of the rechargeable battery, wherein the degradation indicator is measured independently from the usage quantity, and a device for storing a reference degradation map, the reference degradation map being a two-dimensional map whose axes are the degradation indicator and the usage quantity and being divided into at least a normally degrading region and an abnormally degrading region, and a device for determining whether the pair of the measured degradation indicator and the determined usage quantity belongs in the normally degrading region or the abnormally degrading region of the reference degradation map.

7. A battery diagnosing device for estimating a future usage quantity of a rechargeable battery, comprising:

a device for determining a usage quantity that indicates how much the rechargeable battery has been used, a device for measuring a degradation indicator that changes in accordance with progress of the degradation of the rechargeable battery, wherein the degradation indicator is measured independently from the usage quantity, a device for storing at least one pair of a previously measured value of the degradation indicator and a previously determined value of the usage quantity, and a device for estimating, based upon the at least one pair of the previously measured/determined values and the pair of presently measured/determined values of the degradation indicator and the usage quantity, the future usage quantity that indicates how much the rechargeable battery can be further used until the degradation indicator exceeds a predetermined level.

8. A battery diagnosing device for estimating a future usage quantity of a rechargeable battery, comprising:

a device for determining a usage quantity that indicates how much the rechargeable battery has been used, a device for measuring a degradation indicator that changes in accordance with progress of the degradation of the rechargeable battery, wherein the degradation indicator is measured independently from the usage quantity, a device for storing a standard relationship between the change in the degradation indicator and increase of the usage quantity, and a device for estimating, based upon the pair of the measured degradation indicator and the determined usage quantity, and the standard relationship, the future usage quantity that indicates how much the rechargeable battery can be further used until the degradation indicator exceeds a predetermined level.

9. A battery diagnosing device for determining whether a rechargeable battery is in an active state or a non-active state, comprising:

a device for measuring a first degradation indicator that changes in accordance with progress of the degradation of the rechargeable battery, a device for measuring a second degradation indicator that changes in accordance with progress of the degradation of the rechargeable battery, a device for storing a reference activity map, the reference activity map being a two-dimensional map whose axes are the first degradation indicator and the second degradation indicator and being divided into at least an active region and a non-active region, and a device for determining whether the pair of the measured first degradation indicator and the measured second degradation indicator belongs in the active region or the non-active region of the reference activity map.

10. A battery diagnosing device as set forth in claim 9, wherein the first degradation indicator is internal resistance of the battery, and the second degradation indicator is charging/discharging capacity of the battery.

11. An adaptor with a battery diagnosing device and to be interposed between a charging device and a rechargeable battery, the battery diagnosing device comprising a device for measuring a first degradation indicator that changes in accordance with progress of the degradation of the rechargeable battery, a device for measuring a second degradation indicator that changes in accordance with progress of the degradation of the rechargeable battery, a device for storing a reference activity map, the reference activity map being a two-dimensional map whose axes are the first degradation indicator and the second degradation indicator and being divided into at least an active region and a non-active region, and a device for determining whether the pair of the measured first degradation indicator and the measured second degradation indicator belongs in the active region or the non-active region of the reference activity map, comprising:

a circuit for conducting a charging current from the charging device to the battery, a circuit for discharging current from the rechargeable battery, a circuit for selecting either the conducting circuit or the discharging circuit to function, and a means for switching the selecting circuit such that the discharging circuit functions when the battery diagnosing device determines that the pair of measured degradation indicators is in the non-active region.

12. A battery diagnosing method for determining whether a rechargeable battery has degraded normally or abnormally, comprising:

determining a usage quantity that indicates how much the rechargeable battery has been used, measuring a degradation indicator that changes in accordance with progress of the degradation of the rechargeable battery, wherein the degradation indicator is measured independently from the usage quantity, comparing a reference usage quantity with the determined usage quantity when the measured degradation indicator has exceeded a reference degradation value, wherein the reference usage quantity indicates how much the rechargeable battery can be used normally until the degradation indicator exceeds the reference degradation value.

13. A battery diagnosing method for determining whether a rechargeable battery is degrading normally or abnormally, comprising:

determining a usage quantity that indicates how much the rechargeable battery has been used, measuring a degradation indicator that changes in accordance with progress of the degradation of the rechargeable battery, wherein the degradation indicator is measured independently from the usage quantity, and determining whether the pair of the measured degradation indicator and the determined usage quantity belongs in a normally degrading region or a abnormally degrading region of a reference degradation map, the reference degradation map being a two-dimensional map whose axes are the degradation indicator and the usage quantity and being divided into at least the normally degrading region and the abnormally degrading region.

14. A battery diagnosing method for estimating a future usage quantity of a rechargeable battery, comprising:
- determining a usage quantity at least twice, the usage quantity indicating how much the rechargeable battery has been used,
- measuring a degradation indicator simultaneously with the determinations of the usage quantity, the degradation indicator changing in accordance with progress of the degradation of the rechargeable battery, wherein the degradation indicator is measured independently from the usage quantity, and
- estimating, based upon a plurality of pairs of the measured degradation indicator and the determined usage quantity, the future usage quantity that indicates how much the rechargeable battery may be further used until the measured degradation indicator exceeds a predetermined level.

15. A battery diagnosing method for estimating a future usage quantity of a rechargeable battery, comprising:
- determining a usage quantity that indicates how much the rechargeable battery has been used,
- measuring a degradation indicator that changes in accordance with progress of the degradation of the rechargeable battery, wherein the degradation indicator is measured independently from the usage quantity, and
- estimating, based upon the pair of the measured degradation indicator and the determined usage quantity, and a standard relationship between the change in the degradation indicator and increase of the usage quantity, the future usage quantity that indicates how much the rechargeable battery can be further used until the degradation indicator exceeds a predetermined level.

16. A battery diagnosing method for determining whether a rechargeable battery is in an active state or a non-active state, comprising:
- measuring a first degradation indicator that changes in accordance with progress of the degradation of the rechargeable battery,
- measuring a second degradation indicator that changes in accordance with progress of the degradation of the rechargeable battery,
- determining whether the pair of the measured first degradation indicator and the measured second degradation indicator belongs in an active region or a non-active region within predetermined reference activity map, the reference activity map being a two-dimensional map whose axes are the first degradation indicator and the second degradation indicator and being divided into at least the active region and the non-active region.

* * * * *